(12) United States Patent
Ju

(10) Patent No.: US 11,802,897 B2
(45) Date of Patent: Oct. 31, 2023

(54) INSULATION IMPEDANCE DETECTION METHOD, APPARATUS, AND SYSTEM

(71) Applicant: Huawei Digital Power Technologies Co., Ltd., Shenzhen (CN)

(72) Inventor: Hualei Ju, Shanghai (CN)

(73) Assignee: HUAWEI DIGITAL POWER TECHNOLOGIES CO., LTD., Guangdong (CN)

( * ) Notice: Subject to any disclaimer, the term of this patent is extended or adjusted under 35 U.S.C. 154(b) by 91 days.

(21) Appl. No.: 17/675,388

(22) Filed: Feb. 18, 2022

(65) Prior Publication Data

US 2022/0268822 A1 Aug. 25, 2022

(30) Foreign Application Priority Data

Feb. 19, 2021 (CN) .......................... 202110191269.2

(51) Int. Cl.
*G01R 27/18* (2006.01)
*G01R 31/58* (2020.01)
(Continued)

(52) U.S. Cl.
CPC ........... *G01R 27/18* (2013.01); *G01R 27/025* (2013.01); *G01R 31/52* (2020.01); *G01R 31/56* (2020.01);
(Continued)

(58) Field of Classification Search
CPC .................. G01R 27/025; G01R 31/52; G01R 31/56–58; G01R 27/16–205;
(Continued)

(56) References Cited

U.S. PATENT DOCUMENTS

| 9,274,159 | B2 * | 3/2016 | Wang | B60L 50/51 |
| 9,720,025 | B2 * | 8/2017 | Hermeling | G01R 31/52 |
| 9,923,517 | B1 * | 3/2018 | Wang | H02S 50/10 |
| 11,469,708 | B2 * | 10/2022 | Zeng | G01R 31/50 |

(Continued)

FOREIGN PATENT DOCUMENTS

| CN | 108896822 A | 11/2018 |
| CN | 110346644 A | 10/2019 |

(Continued)

*Primary Examiner* — Judy Nguyen
*Assistant Examiner* — James Split
(74) *Attorney, Agent, or Firm* — WOMBLE BOND DICKINSON (US) LLP

(57) ABSTRACT

An insulation impedance detection method includes: An inverter injects a first common-mode voltage into an alternating current side, where the first common-mode voltage is divided by an alternating current grounding insulation impedance of an alternating current cable and a direct current grounding insulation impedance of a photovoltaic unit. The inverter can obtain an impedance value of the alternating current grounding insulation impedance based on the first common-mode voltage, a voltage divided by the alternating current grounding insulation impedance for the first common-mode voltage (a second common-mode voltage on the alternating current grounding insulation impedance), and an impedance value of the direct current grounding insulation impedance. The alternating current grounding insulation impedance is detected by using a necessary device, namely, the inverter in a photovoltaic power generation system. In this way, an additional detection device is not mounted, which reduces costs and complexity of alternating current grounding insulation impedance detection.

18 Claims, 4 Drawing Sheets

(51) Int. Cl.
    *G01R 31/56*     (2020.01)
    *H02S 50/10*     (2014.01)
    *G01R 27/02*     (2006.01)
    *G01R 31/52*     (2020.01)
    *H02M 7/44*     (2006.01)

(52) U.S. Cl.
    CPC .............. *G01R 31/58* (2020.01); *H02S 50/10* (2014.12); *H02M 7/44* (2013.01)

(58) Field of Classification Search
    CPC ... G01R 31/40; G01R 31/42; H02S 50/00–10; H02M 7/42–44
    See application file for complete search history.

(56) References Cited

U.S. PATENT DOCUMENTS

| | | | |
|---|---|---|---|
| 11,500,001 B2 * | 11/2022 | Wang | H02M 7/44 |
| 11,525,867 B2 * | 12/2022 | Bohlländer | G01R 31/42 |
| 2014/0306544 A1 * | 10/2014 | Hantschel | H02M 7/537 |
| | | | 363/71 |
| 2020/0326385 A1 * | 10/2020 | Liu | H02H 1/0015 |
| 2021/0063494 A1 | 3/2021 | Katsukura et al. | |

FOREIGN PATENT DOCUMENTS

| | | |
|---|---|---|
| CN | 107748292 B | 3/2020 |
| EP | 2230522 A1 | 9/2010 |
| EP | 3929598 A1 | 12/2021 |
| WO | 2014079775 A1 | 5/2014 |
| WO | 2019016867 A1 | 1/2019 |
| WO | 2021017687 A1 | 2/2021 |
| WO | WO-2022112393 A1 * | 6/2022 |

\* cited by examiner

INSULATION IMPEDANCE DETECTION METHOD, APPARATUS, AND SYSTEM

CROSS-REFERENCE TO RELATED APPLICATION

This application claims priority to Chinese Patent Application No. 202110191269.2, filed on Feb. 19, 2021, which is hereby incorporated by reference in its entirety.

TECHNICAL FIELD

This application relates to the field of photoelectric technologies, and in particular, to an insulation impedance detection method, an apparatus, and a system.

BACKGROUND

In recent years, a photovoltaic power generation system is increasingly widely used in the field of power electronics. The photovoltaic power generation system can convert clean and pollution-free solar energy into electrical energy that can not only be supplied to residential devices to meet daily power supply requirements of residents, but also be merged into a grid for storage. When the photovoltaic power generation system is applied to the field of power electronics, reliability of residential electricity consumption can be effectively improved.

However, in the photovoltaic power generation system, the converted electrical energy is input into the residential devices or merged into the grid by using an alternating current cable, and the alternating current cable has an alternating current grounding insulation impedance. When the alternating current grounding insulation impedance is relatively small, it indicates that insulation performance between the alternating current cable and ground is relatively poor, and the alternating current cable is at risk of electric leakage or short-circuit grounding. This not only affects safety of residential electricity consumption, but also worsens power supply stability of the photovoltaic power generation system, and reduces reliability of the photovoltaic power generation system. Therefore, to maintain reliability of the photovoltaic power generation system, the alternating current grounding insulation impedance in the photovoltaic power generation system further needs to be detected, to identify, in a timely manner, an abnormal phenomenon of the alternating current grounding insulation impedance that occurs in the photovoltaic power generation system, to help a user rectify the abnormality in a timely manner, thereby restoring reliability of the photovoltaic power generation system.

In the conventional technology, a dedicated detection device, such as an insulation monitor device (IMD), is usually additionally mounted in the photovoltaic power generation system, and the dedicated detection device is used to detect the alternating current grounding insulation impedance of the photovoltaic power generation system. However, the dedicated detection device usually has a complex structure and a high price, and the additional mounting of the dedicated detection device not only increases construction costs and maintenance costs of the photovoltaic power generation system, but also makes a structure of the photovoltaic power generation system become more complex. Therefore, how to detect the alternating current grounding insulation impedance in the photovoltaic power generation system with lower costs and lower complexity has become a problem that urgently needs to be resolved at present.

SUMMARY

This application provides an insulation impedance detection method, an apparatus, and a system, to reduce costs and complexity of alternating current grounding insulation impedance detection.

According to a first aspect, this application provides an insulation impedance detection method. The method may be implemented by an inverter, for example, an inverter in a photovoltaic power generation system. An input terminal of the inverter is connected to a photovoltaic unit. An output terminal of the inverter is connected to a power consumption device or a grid by using an alternating current cable. The photovoltaic unit has a direct current grounding insulation impedance. The alternating current cable has an alternating current grounding insulation impedance. During implementation, the inverter may first inject a first common-mode voltage into the alternating current cable between the output terminal of the inverter and the power consumption device. The first common-mode voltage is divided by the alternating current grounding insulation impedance and the direct current grounding insulation impedance. The first common-mode voltage is equal to a sum of a voltage on the alternating current grounding insulation impedance and a voltage on the direct current grounding insulation impedance. In this way, the inverter obtains a second common-mode voltage on the alternating current grounding insulation impedance, and may obtain an impedance value of the alternating current grounding insulation impedance based on the first common-mode voltage, the second common-mode voltage, and an impedance value of the direct current grounding insulation impedance.

In the foregoing solution, the inverter is a necessary device in the photovoltaic power generation system. The alternating current grounding insulation impedance in the photovoltaic power generation system is detected by using the necessary device, namely, the inverter, so that not only an additional detection device can be prevented from being mounted, to reduce costs and complexity of alternating current grounding insulation impedance detection, but also various photovoltaic power generation systems with the inverter can be compatible, to effectively improve commonality of the alternating current grounding insulation impedance detection method. In addition, the alternating current grounding insulation impedance detection method is integrated in the inverter, so that the inverter can further implement both an electrical energy conversion function and an insulation impedance detection function, to effectively improve resource utilization of the photovoltaic power generation system.

In an embodiment, considering that an impedance of a conductor inside the photovoltaic unit and an impedance of a conductor inside the inverter are both relatively small, impact of the impedance of the conductor inside the photovoltaic unit and the impedance of the conductor inside the inverter may be directly ignored. In this way, the first common-mode voltage can be shared only by the alternating current grounding insulation impedance and the direct current grounding insulation impedance that are connected in series. In this case, the inverter can calculate the impedance value of the alternating current grounding insulation impedance according to a principle that currents in a series connection are consistent. For example:

In a calculation manner, the inverter can calculate, based on the first common-mode voltage, the alternating current grounding insulation impedance, and the direct current grounding insulation impedance, a current flowing through a loop on which the alternating current grounding insulation impedance and the direct current grounding insulation impedance that are connected in series are located, can calculate, based on the second common-mode voltage on the alternating current grounding insulation impedance, and the alternating current grounding insulation impedance, a current flowing through the alternating current grounding insulation impedance, and may parse out the impedance value of the alternating current grounding insulation impedance based on a voltage value of the first common-mode voltage, a voltage value of the second common-mode voltage, and the impedance value of the direct current grounding insulation impedance and according to the principle that the current flowing through the loop is consistent with the current flowing through the alternating current grounding insulation impedance.

In another calculation manner, because the first common-mode voltage is shared only by the alternating current grounding insulation impedance and the direct current grounding insulation impedance that are connected in series, the inverter can calculate a third common-mode voltage on the direct current grounding insulation impedance based on the first common-mode voltage and the second common-mode voltage that is on the alternating current grounding insulation impedance, can calculate a current flowing through the direct current grounding insulation impedance based on the third common-mode voltage on the direct current grounding insulation impedance and the direct current grounding insulation impedance, can calculate a current flowing through the alternating current grounding insulation impedance based on the second common-mode voltage on the alternating current grounding insulation impedance and the alternating current grounding insulation impedance, and can parse out the impedance value of the alternating current grounding insulation impedance based on a voltage value of the first common-mode voltage, a voltage value of the second common-mode voltage, and the impedance value of the direct current grounding insulation impedance and according to the principle that the current flowing through the direct current grounding insulation impedance is consistent with the current flowing through the alternating current grounding insulation impedance.

In the foregoing design, the inverter injects the first common-mode voltage as an excitation source, and can calculate the impedance value of the alternating current grounding insulation impedance by using a voltage division ratio of the excitation source on the direct current grounding insulation impedance and the alternating current grounding insulation impedance. This detection manner has a simple logic and is easy to implement, to help detect the impedance value of the alternating current grounding insulation impedance more quickly.

In an embodiment, the impedance value of the direct current grounding insulation impedance may be obtained in the following manner: The inverter obtains the impedance value of the direct current grounding insulation impedance based on electrical characteristics output by the photovoltaic unit. In this way, a process of detecting the direct current grounding insulation impedance is also performed on a side of the necessary device, namely, the inverter, so that another component can be prevented from being additionally introduced in the process of detecting the direct current grounding insulation impedance, to further improve commonality of the impedance detection method.

In an embodiment, the photovoltaic unit is connected to the inverter by using a direct current cable. When needing to obtain the impedance value of the direct current grounding insulation impedance, the inverter may control the direct current cable to be grounded by using a preset impedor. In this way, a first voltage of the photovoltaic unit is divided by the preset impedor and the direct current grounding insulation impedance, and the first voltage is equal to a sum of a voltage on the preset impedor and the voltage on the direct current grounding insulation impedance. In this case, the inverter may first acquire the first voltage of the photovoltaic unit, then acquire a second voltage of the preset impedor, and then obtain the impedance value of the direct current grounding insulation impedance based on the first voltage, the second voltage, and the impedance value of the preset impedor. This design can implement unified supervision of the inverter for the entire impedance detection process (including the direct current grounding insulation impedance and the alternating current grounding insulation impedance), to effectively improve flexibility of impedance detection.

In an embodiment, before the inverter injects the first common-mode voltage into the alternating current cable, the inverter may first merge electrical energy output by the photovoltaic unit into the power consumption device or the grid. In this way, a differential mode voltage output by the photovoltaic unit is directly merged into the user equipment or the grid, so that the first common-mode voltage injected by the inverter can be divided by the preset direct current grounding insulation impedance and alternating current grounding insulation impedance, and the inverter can detect the alternating current grounding insulation impedance by using the injected first common-mode voltage.

In an embodiment, the first common-mode voltage may be an alternating current voltage. In this case, the inverter may inject the first common-mode voltage of a first frequency into the alternating current cable, and after acquiring a fourth common-mode voltage on the alternating current cable, the inverter extracts, from the fourth common-mode voltage, the second common-mode voltage having the first frequency. In this way, detection is completed by using intra-frequency common-mode voltages, so that the detection process can be prevented from being interfered by a common-mode voltage of another frequency, to effectively improve accuracy of alternating current grounding insulation impedance detection.

In an embodiment, the alternating current grounding insulation impedance may include alternating current grounding insulation impedance and alternating current grounding insulation capacitance. In this case, the inverter may separately inject at least two first common-mode voltages with different voltage characteristics into the alternating current cable, and determine, based on the first common-mode voltage with each voltage characteristic, the second common-mode voltage corresponding to the first common-mode voltage with each voltage characteristic, and the impedance value of the direct current grounding insulation impedance, an association relationship that is between the alternating current grounding insulation impedance and the alternating current grounding insulation capacitance and that corresponds to the first common-mode voltage with each voltage characteristic. In this way, the inverter may obtain, based on association relationships that are between the alternating current grounding insulation impedance and the alternating current grounding insulation capacitance and that respectively correspond to the at least two first common-mode voltages with different voltage characteristics, an impedance value of the alternating current grounding insulation impedance and a capacitance value of the alternating current grounding insulation capacitance. In this design, detection is performed for a plurality of times by using the first common-mode voltages with different voltage characteristics, so that not only a parameter value of each parameter can be calculated when the alternating current grounding insulation impedance includes at least two parameters (for example, the alternating current grounding insulation impedance and the alternating current grounding insulation capacitance), but also a relatively accurate parameter value can be found through detection for a plurality of times, to avoid fortuity of calculation to the greatest extent, thereby improving detection accuracy.

In an embodiment, the alternating current cable may be a single-phase cable. This design can detect the alternating current grounding insulation impedance of the single-phase cable in a scenario in which the inverter is connected to the power consumption device (or the grid) by using the single-phase cable.

In an embodiment, the alternating current cable may be a three-phase cable, and correspondingly, the alternating current grounding insulation impedance may also include three alternating current grounding insulation subimpedances respectively corresponding to the three-phase cable. In this case, the inverter may separately inject three first common-mode voltages with different voltage characteristics into the alternating current cable, and then determine, based on the first common-mode voltage with each voltage characteristic, the second common-mode voltage corresponding to the first common-mode voltage with each voltage characteristic, and the impedance value of the direct current grounding insulation impedance, an association relationship that is between the three alternating current grounding insulation subimpedances and that corresponds to the first common-mode voltage with each voltage characteristic, and then obtain, based on association relationships that are between the three alternating current grounding insulation subimpedances and that respectively correspond to the three first common-mode voltages with different voltage characteristics, impedance values respectively corresponding to the three alternating current grounding insulation subimpedances. This design can detect the alternating current grounding insulation sub-impedance of each phase of cable in the three-phase cable in a scenario in which the inverter is connected to the power consumption device (or the grid) by using the single-phase cable.

In an embodiment, when the first common-mode voltage is a voltage in an alternating current form, the voltage characteristic may include one or more of a frequency, an amplitude, or a phase. When the first common-mode voltage is a voltage in a direct current form, the voltage characteristic may include an amplitude and/or a phase. This design not only can select to inject first common-mode voltages of different types based on an actual requirement of a user, but also can complete detection by using a voltage characteristic of the first common-mode voltage of each type, to improve detection accuracy and compatibility for various photovoltaic power generation systems.

In an embodiment, when the output terminal of the inverter is connected to the grid by using the alternating current cable, the output terminal of the inverter may be connected to an input terminal of an isolation transformer, and an output terminal of the isolation transformer may be connected to the grid. The isolation transformer is disposed between the inverter and the grid, so that electrical insulation between the inverter and the grid can be implemented, to reduce mutual interference between the inverter and the grid.

According to a second aspect, this application provides an inverter. The inverter includes a control circuit, an inverter circuit, and a voltage sampling circuit. The control circuit is separately connected to a control terminal of the inverter circuit and an output terminal of the voltage sampling circuit, an input terminal of the inverter circuit is connected to a photovoltaic unit, the photovoltaic unit has a direct current grounding insulation impedance, an output terminal of the inverter circuit is connected to a power consumption device or a grid by using an alternating current cable, and the alternating current cable has an alternating current grounding insulation impedance. During implementation, the inverter circuit is configured to: convert direct current electrical energy from the photovoltaic unit into alternating current electrical energy and then merge the alternating current electrical energy into the power consumption device or the grid; the control circuit is configured to control the inverter circuit to inject a first common-mode voltage into the alternating current cable, where the first common-mode voltage is divided by the alternating current grounding insulation impedance and the direct-current grounding insulation impedance, the first common-mode voltage is equal to a sum of a voltage on the alternating current grounding insulation impedance and a voltage on the direct current grounding insulation impedance; the voltage sampling circuit is configured to: acquire a second common-mode voltage on the alternating current grounding insulation impedance and send the second common-mode voltage to the control circuit; and the control circuit is further configured to obtain an impedance value of the alternating current grounding insulation impedance based on the first common-mode voltage, the second common-mode voltage, and an impedance value of the direct current grounding insulation impedance.

In an embodiment, the control circuit may be further connected to the photovoltaic unit. In this case, before the inverter circuit merges the electrical energy from the photovoltaic unit into the power consumption device or the grid, the control circuit may further obtain the impedance value of the direct current grounding insulation impedance based on electrical characteristics output by the photovoltaic unit.

In an embodiment, the inverter may further include a preset impedor, where the photovoltaic unit is connected to the inverter circuit by using a direct current cable, and the direct current cable is grounded by using the preset impedor. In this case, before the inverter circuit merges the electrical energy from the photovoltaic unit into the power consumption device or the grid, the voltage sampling circuit may further acquire a first voltage of the photovoltaic unit and send the first voltage to the control circuit, and acquire a second voltage of the preset impedor and send the second voltage to the control circuit, where the first voltage is divided by the preset impedor and the direct current grounding insulation impedance, and is equal to a sum of a voltage on the preset impedor and the voltage on the direct current grounding insulation impedance. In this way, the control circuit may obtain the impedance value of the direct current grounding insulation impedance based on the first voltage, the second voltage, and an impedance value of the preset impedor.

In an embodiment, before the inverter circuit injects the first common-mode voltage into the alternating current cable, the control circuit may further first control the inverter circuit to merge the electrical energy output by the photovoltaic unit into the power consumption device or the grid.

In an embodiment, the control circuit may first determine a differential voltage between the first common-mode voltage and the second common-mode voltage as a third common-mode voltage on the direct current grounding insulation impedance, then determine a ratio of the second common-mode voltage to the third common-mode voltage as a voltage division ratio of the alternating current grounding insulation impedance to the direct current grounding insulation impedance, and finally obtain the impedance value of the alternating current grounding insulation impedance based on the voltage division ratio and the impedance value of the direct current grounding insulation impedance.

In an embodiment, the first common-mode voltage may be an alternating current voltage. In this case, the control circuit may control the inverter circuit to inject the first common-mode voltage of a first frequency into the alternating current cable, and the voltage sampling circuit may acquire a fourth common-mode voltage on the alternating current cable, extract, from the fourth common-mode voltage, the second common-mode voltage having the first frequency, and send the second common-mode voltage to the control circuit.

In an embodiment, the alternating current grounding insulation impedance may include alternating current grounding insulation impedance and alternating current grounding insulation capacitance. In this case, the control circuit may control the inverter circuit to separately inject at least two first common-mode voltages with different voltage characteristics into the alternating current cable; the voltage sampling circuit may separately acquire second common-mode voltages on the alternating current grounding insulation impedance at the at least two first common-mode voltages with different voltage characteristics, and send the second common-mode voltages to the control circuit; and the control circuit may determine, based on the first common-mode voltage with each voltage characteristic, the second common-mode voltage corresponding to the first common-mode voltage with each voltage characteristic, and the impedance value of the direct current grounding insulation impedance, an association relationship that is between the alternating current grounding insulation impedance and the alternating current grounding insulation capacitance and that corresponds to the first common-mode voltage with each voltage characteristic; and obtain, based on association relationships that are between the alternating current grounding insulation impedance and the alternating current grounding insulation capacitance and that respectively correspond to the at least two first common-mode voltages with different voltage characteristics, an impedance value of the alternating current grounding insulation impedance and a capacitance value of the alternating current grounding insulation capacitance.

In an embodiment, the alternating current cable may be a single-phase cable.

In an embodiment, the alternating current cable may be a three-phase cable, and correspondingly, the alternating current grounding insulation impedance may also include three alternating current grounding insulation subimpedances respectively corresponding to the three-phase cable. In this case, the control circuit may separately inject three first common-mode voltages with different voltage characteristics into the alternating current cable; the voltage sampling circuit may separately acquire second common-mode voltages on the alternating current grounding insulation impedance at the three first common-mode voltages with different voltage characteristics, and send the second common-mode voltages to the control circuit; and the control circuit may determine, based on the first common-mode voltage with each voltage characteristic, the second common-mode voltage corresponding to the first common-mode voltage with each voltage characteristic, and the impedance value of the direct current grounding insulation impedance, an association relationship that is between the three alternating current grounding insulation subimpedances and that corresponds to the first common-mode voltage with each voltage characteristic; and obtain, based on association relationships that are between the three alternating current grounding insulation subimpedances and that respectively correspond to the three first common-mode voltages with different voltage characteristics, impedance values respectively corresponding to the three alternating current grounding insulation subimpedances.

In an embodiment, when the first common-mode voltage is a voltage in an alternating current form, the voltage characteristic may include one or more of a frequency, an amplitude, or a phase; or when the first common-mode voltage is a voltage in a direct current form, the voltage characteristic may include an amplitude and/or a phase.

In an embodiment, an output terminal of the inverter may be connected to an input terminal of an isolation transformer, and an output terminal of the isolation transformer may be connected to the grid.

According to a third aspect, this application provides a photovoltaic power generation system. The photovoltaic power generation system includes the inverter in any design of the second aspect, a photovoltaic unit, and a power consumption device or a grid. During implementation, the photovoltaic unit is configured to: convert photon energy into electrical energy in a direct current form, and then transmit the electrical energy to the inverter, the inverter is configured to: when determining that an alternating current grounding insulation impedance is not less than a preset impedance threshold, convert the electrical energy in the direct current form into electrical energy in an alternating current form and then merge the electrical energy in the alternating current form into the power consumption device or the grid; and the power consumption device or the grid is configured to receive the electrical energy in the alternating current form.

In an embodiment, the photovoltaic unit may further include an isolation transformer, where an input terminal of the isolation transformer is connected to an output terminal of the inverter, and an output terminal of the isolation transformer is connected to the grid.

According to a fourth aspect, this application provides a computer-readable storage medium. The computer-readable storage medium stores program code. When the program code is run on a computer, the computer is enabled to perform the method in any design of the first aspect.

According to a fifth aspect, this application provides a chip. The chip may be a chip in an inverter. The chip is configured to perform the method in any design of the first aspect.

For beneficial effects of the second aspect to the fifth aspect, refer to beneficial effects corresponding to the designs in the first aspect for details. Details are not described herein again.

DESCRIPTION OF EMBODIMENTS

Figure 1:
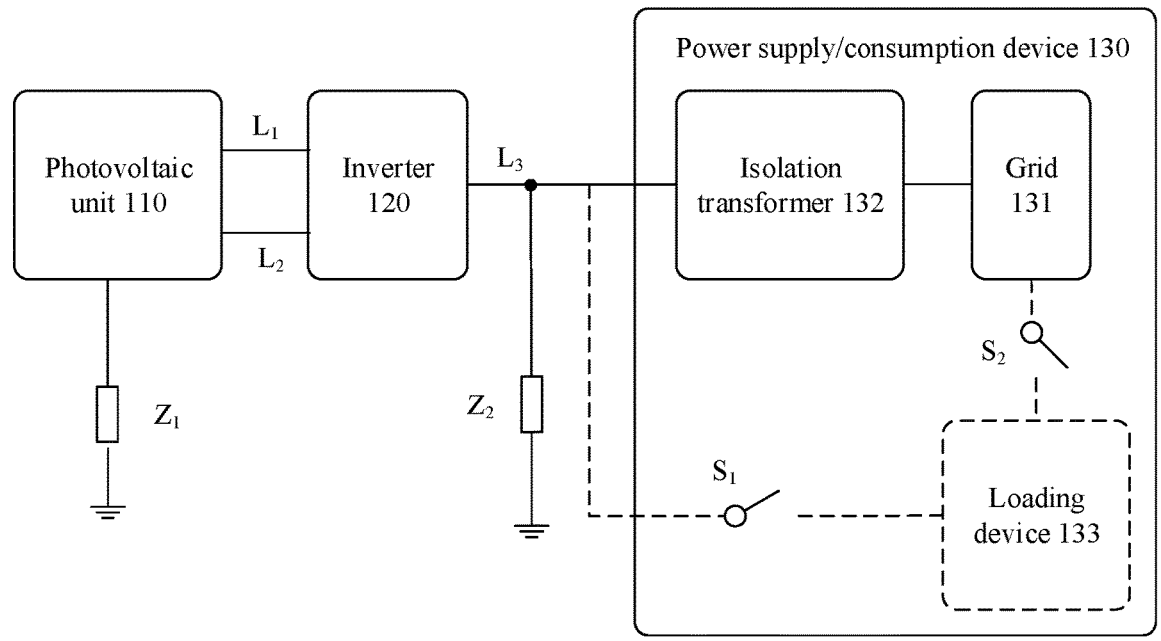
FIG. 1 is an example schematic diagram of a system architecture of a photovoltaic power generation system.

Before specific implementations are described, some terms used in the following embodiments of this application are described by using examples:

(1) Direct Current and Alternating Current.

The direct current in the embodiments of this application is an electrical form in which electrical energy is conducted in a constant direction in a circuit. A conduction direction of electrical energy is also referred to as a phase, and the phase of the direct current may be positive or negative. Electrical energy intensity of most direct currents is fixed. In some special direct currents (such as pulse direct currents), electrical energy intensity also changes over time. The electrical energy intensity is also referred to as a current amplitude. Common direct current power supplies include dry batteries, storage batteries, direct current uninterrupted power supplies, or the like.

The alternating current in the embodiments of this application is an electrical form in which electrical energy is conducted in a direction that changes periodically in a circuit. Electrical energy intensity of most alternating currents also changes periodically over time. A periodic change of the alternating current in the conduction direction is defined by a frequency of the alternating current. As the frequency of the alternating current increases, the alternating current can change the conduction direction faster, and as the frequency of the alternating current decreases, the alternating current can change the conduction direction slowly. Common alternating current power supplies include mains, industrial and agricultural power supplies, residential power supplies, and the like.

(2) Common-Mode Voltage and Differential Mode Voltage.

The common-mode voltage in the embodiments of this application is a voltage between a phase of cable and a reference point, where the reference point is usually ground. When an input terminal is connected to an output terminal by using a single-phase cable, the common-mode voltage on the single-phase cable is a potential difference between a potential on the single-phase cable and a reference potential of the reference point. When the input terminal is connected to the output terminal by using at least two phases of cables, the common-mode voltage on the at least two phases of cables is an average value of at least two potential differences between potentials on the at least two phases of cables and the reference potential of the reference point. For example, assuming that the input terminal is connected to the output terminal by using a three-phase cable including a phase-a cable, a phase-b cable, and a phase-c cable, the common-mode voltage on the three-phase cable may be represented by the following formula (1.1):

$$V_{gm}=(V_a+V_b+V_c)/3 \qquad (1.1)$$

$V_{gm}$ represents the common-mode voltage on the three-phase cable, $V_a$ represents a potential difference between a potential on the phase-a cable and the reference potential of the reference point, $V_b$ represents a potential difference between a potential on the phase-b cable and the reference potential of the reference point, and $V_c$ represents a potential difference between a potential on the phase-c cable and the reference potential of the reference point.

The differential mode voltage in the embodiments of this application is a voltage between one phase of cable and another phase of cable. For example, assuming that the input terminal is connected to the output terminal by using a two-phase cable including a phase-i cable and a phase-o cable, the phase-i cable is a positive input cable, and the phase-o cable is a negative input cable, the differential mode voltage between the two phases of cables may be represented by the following formula (1.2):

$$V_{cm}=V_i-V_o \qquad (1.2)$$

$V_{cm}$ represents the differential mode voltage on the two-phase cable, $V_i$ represents a potential difference between a potential on the phase-i cable and the reference potential of the reference point, and $V_o$ represents a potential difference between a potential on the phase-o cable and the reference potential of the reference point.

(3) Potential Induced Degradation (PID) Phenomenon of Solar Cells.

In a photovoltaic power generation system, a ground bias potential difference is formed between a solar cell and ground in a power generation process, and the ground bias potential difference, as an influencing factor, damages a substrate of the solar cell in turn, affecting a power generation capability of the solar cell. It is found through researches that, after the solar cell is used for three to four years or even a shorter time, power generation efficiency of the solar cell drops significantly, which leads to a large decrease in an electric energy yield of the entire photovoltaic power generation system. This phenomenon is referred to as the PID phenomenon of the solar cell. The PID phenomenon of the solar cell is harmful to the photovoltaic power generation system, and theoretically, should be avoided or alleviated to the greatest extent.

The following clearly describes technical solutions in the embodiments of this application with reference to the accompanying drawings in the embodiments of this application.

FIG. 1 is an example schematic diagram of a system architecture of a photovoltaic power generation system. As shown in FIG. 1, the system architecture may include a photovoltaic (PV) unit 110, an inverter 120, and a power supply/consumption device 130. An output terminal of the photovoltaic unit 110 is connected to an input terminal of the inverter 120, and an output terminal of the inverter 120 is connected to the power supply/consumption device 130. The photovoltaic unit 110 is configured to: receive irradiation energy of sunlight, and convert the received irradiation energy into electrical energy in a direct current form. The photovoltaic unit 110 may be a photovoltaic module obtained by connecting a plurality of solar cells in series and/or in parallel, or may be a photovoltaic string obtained by connecting a plurality of photovoltaic modules in series and/or in parallel, or may be a photovoltaic string set including a plurality of photovoltaic strings. The photovoltaic string is also referred to as a photovoltaic panel or a photovoltaic array. The inverter 120 is also referred to as a photovoltaic inverter, and is configured to: receive the electrical energy in the direct current form from the photovoltaic unit 110, and convert the electrical energy in the direct current form into electrical energy in an alternating current form, and then merge the electrical energy in the alternating current form into the power supply/consumption device 130.

As shown in FIG. 1, the photovoltaic unit 110 may input the electrical energy in the direct current form into the inverter 120 by using a direct current cable $L_1$ and a direct current cable $L_2$. In this case, a voltage received by the inverter 120 is a differential mode voltage between the direct current cable $L_1$ and the direct current cable $L_2$. For example, when the direct current cable $L_1$ is a positive input cable and the direct current cable $L_2$ is a negative input cable, the voltage received by the inverter 120 is a differential mode voltage obtained by subtracting a common-mode voltage on the direct current cable $L_2$ from a common-mode voltage on the direct current cable $L_1$; or when the direct current cable $L_1$ is a negative input cable and the direct current cable $L_2$ is a positive input cable, the voltage received by the inverter 120 is a differential mode voltage obtained by subtracting a common-mode voltage on the direct current cable $L_1$ from a common-mode voltage on the direct current cable $L_2$. Further, after converting the received electrical energy in the direct current form into the electrical energy in the alternating current form, the inverter 120 may input the electrical energy in the alternating current form into the power supply/consumption device 130 by using an alternating current cable $L_3$. The alternating current cable $L_3$ may be a single-phase alternating current cable or a three-phase alternating current cable. This is not specifically limited.

In the embodiments of this application, the power supply/consumption device 130 may be one of the following cases:

In a case, the power supply/consumption device 130 is a power supply device, for example, may include a grid 131 shown in FIG. 1. In this case, the inverter 120 may first merge the electrical energy in the alternating current form into the grid 131, and then convert the electrical energy into mains by using the grid 131, and provide the mains for residents for use. Considering that on a side of the grid 131, a photovoltaic power generation process of the inverter 120 and the photovoltaic unit 110 may be affected when a voltage is unstable, the power supply/consumption device 130 may further include an isolation transformer 132 shown in FIG. 1. The output terminal of the inverter 120 is connected to an input terminal of the isolation transformer 132, and an output terminal of the isolation transformer 132 is connected to the grid 131. The isolation transformer 132 is disposed between the inverter 120 and the grid 131, so that electrical insulation between the inverter 120 and the grid 131 can be implemented, to reduce mutual interference between the inverter 120 and the grid 131.

In another case, the power supply/consumption device 130 is a power consumption device, for example, may include a loading device 133 shown in FIG. 1. The loading device 133 may be a household electronic device applicable to alternating current power supply, for example, a refrigerator, an air conditioner, a washing machine, or a television. In this case, the inverter 120 can directly provide the electrical energy in the alternating current form for the household electronic device, to support normal operation of the household electronic device without conversion by using the grid 131.

In another case, the power supply/consumption device 130 is a power supply device and a power consumption device, for example, may include all of the isolation transformer 132, the grid 131, and the loading device 133 described above, and may further include a switching component $S_1$ and a switching component $S_2$. The output terminal of the inverter 120 is connected to the loading device 133 by using the switching component $S_1$, and the output terminal of the grid 131 is connected to the loading device 133 by using the switching component $S_2$. In this case, the photovoltaic power generation system may be a household distributed photovoltaic power generation system. When weather is relatively good, the photovoltaic unit 110 can generate sufficiently stable electrical energy, and therefore a user may conduct the switching component $S_1$, and disconnect the switching component $S_2$, to select, to the greatest extent, the photovoltaic unit 110 to directly supply power to the loading device 133. When weather is bad, the electrical energy generated by the photovoltaic unit 110 may be unstable, and may not be sufficiently stable for use by the loading device 133. Therefore, the user may conduct the switching component $S_2$ and disconnect the switching component $S_1$, to supply power to the loading device 133 by using the grid 131, or conduct the switching component $S_1$ and the switching component $S_2$ at the same time, to use the photovoltaic unit 110 and the grid 131 at the same time to supply power to the loading device 133. By combining the photovoltaic unit 110 and the grid 131 to jointly supply power to the user equipment, reliability of power consumption by the user can be ensured when costs of purchasing electricity by the user are reduced.

The following provides description by using an example in which the power supply/consumption device 130 includes the grid 131 and the isolation transformer 132.

In the photovoltaic power generation system, the alternating current cable $L_3$ between the inverter 120 and the power supply/consumption device 130 usually has an alternating current grounding insulation impedance, for example, an alternating current grounding insulation impedance $Z_2$ shown in FIG. 1. The alternating current grounding insulation impedance $Z_2$ is not an impedor that actually exists, and instead, is a virtual impedor configured to represent a degree of insulation between a conductor inside the alternating current cable $L_3$ and ground. An impedance value of the virtual impedor is related to factors such as electrical conductivity, a thickness, a temperature, and humidity of an insulation medium wrapping the conductor inside the alternating current cable $L_3$. When the electrical conductivity of the insulation medium is higher, the thickness of the insulation medium is smaller, the temperature of the insulation medium is higher, or the humidity of the insulation medium is higher, the impedance value of the alternating current grounding insulation impedance $Z_2$ is smaller. This means that insulation performance between the conductor inside the alternating current cable $L_3$ and ground is poorer, a possibility of electric leakage or short-circuit grounding of the alternating current cable $L_3$ is higher, and stability and reliability of the photovoltaic power generation system are lower. Therefore, to avoid the electric leakage or short-circuit grounding phenomenon, the impedance value of the alternating current grounding insulation impedance $Z_2$ further usually needs to be detected. Once it is found that the impedance value is small to some extent, a dedicated person may be immediately entrusted to perform corrective maintenance on the alternating current cable $L_3$, to identify and rectify an abnormality of the alternating current grounding insulation impedance that occurs in the photovoltaic power generation system, thereby maintaining stability and reliability of the photovoltaic power generation system.

Figure 2:
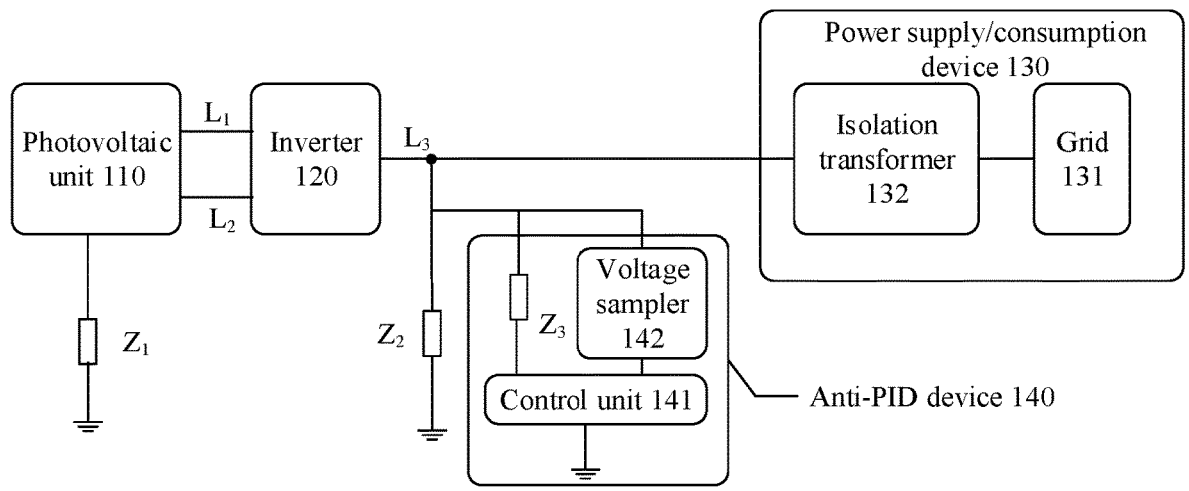
FIG. 2 is an example diagram of a circuit structure for detecting an alternating current grounding insulation impedance based on an anti-PID device.

At a current stage, when the alternating current grounding insulation impedance is detected, a dedicated detection device usually needs to be additionally disposed in the photovoltaic power generation system, and the dedicated detection device completes detection through complex logic calculation. However, this manner clearly increases costs and complexity of the photovoltaic power generation system. To resolve this problem, in an optional implementation, a detection function may alternatively be integrated in an anti-PID device of the photovoltaic power generation system. The anti-PID device is an inherent device preset in some photovoltaic power generation systems, and is configured to inhibit the PID phenomenon of solar cells. FIG. 2 is an example diagram of a circuit structure of the photovoltaic power generation system corresponding to this detection manner. As shown in FIG. 2, a control unit 141 is preset in the anti-PID device 140. The control unit 141 includes an output voltage source. During implementation, the inverter 120 acquires a common-mode voltage to earth of a PV panel in the photovoltaic unit 110, and feeds back the common-mode voltage to earth to the control unit 141. The control unit 141 adjusts an output voltage of the internal output voltage source based on the common-mode voltage to earth, to limit a floating voltage to earth of the photovoltaic unit 110, thereby alleviating, to the greatest extent, damage caused to the photovoltaic unit 110 by the ground bias potential difference generated in the power generation process.

Still refer to FIG. 2. When the alternating current grounding insulation impedance $Z_2$ is detected by using the anti-PID device 140, a voltage sampler 142 and a current-limiting impedor $Z_3$ are further disposed in the anti-PID device 140. An input terminal of the voltage sampler 142 and a terminal of the current-limiting impedor $Z_3$ are separately connected to the output terminal of the inverter 120. An output terminal of the voltage sampler 142 and the other terminal of the current-limiting impedor $Z_3$ are separately connected to the control unit 141. The control unit 141 is further connected to a grounding circuit. During implementation, the control unit 141 first injects a preset common-mode voltage (assumed to be $U_{pid}$) into the current-limiting impedor $Z_3$. Under an effect of the preset common-mode voltage $U_{pid}$, because the current-limiting impedor $Z_3$ and the alternating current grounding insulation impedance $Z_2$ are both connected to the grounding circuit, a loop can be formed among the current-limiting impedor $Z_3$, the alternating current grounding insulation impedance $Z_2$, the grounding circuit, and the control unit 141. When an impedance of the grounding circuit and an impedance of a conductor inside the control unit 141 are ignored, the preset common-mode voltage $U_{pid}$ is provided only for the current-limiting impedor $Z_3$ and the alternating current grounding insulation impedance $Z_2$. To be specific, the preset common-mode voltage $U_{pid}$ is divided by the current-limiting impedor $Z_3$ and the alternating current grounding insulation impedance $Z_2$, and the preset common-mode voltage $U_{pid}$ is equal to a sum of a voltage on the current-limiting impedor $Z_3$ and a voltage on the alternating current grounding insulation impedance $Z_2$ (when the preset common-mode voltage $U_{pid}$ is divided by the current-limiting impedor $Z_3$ and the alternating current grounding insulation impedance $Z_2$, the "voltage on the current-limiting impedor $Z_3$" may also be referred to as a "common-mode voltage obtained by dividing the preset common-mode voltage $U_{pid}$ by the current-limiting impedor $Z_3$", and the "common-mode voltage on the alternating current grounding insulation impedance $Z_2$" may also be referred to as a "common-mode voltage obtained by dividing the preset common-mode voltage $U_{pid}$ by the alternating current grounding insulation impedance $Z_2$"). In this way, after obtaining, from the voltage sampler 142, the common-mode voltage (assumed to be $U_g a$) obtained by dividing the preset common-mode voltage $U_{pid}$ by the alternating current grounding insulation impedance $Z_2$, the control unit 141 can calculate the impedance value of the alternating current grounding insulation impedance $Z_2$ according to the following formula (1.3):

$$\frac{U_{gd}}{U_{pid}} = \frac{Z_2}{Z_2 + Z_3} \qquad (1.3)$$

In the foregoing formula (1.3), the preset common-mode voltage $U_{pid}$ is injected by the anti-PID device 140 into the loop, and a voltage value of the preset common-mode voltage $U_{pid}$ is a known quantity. The current-limiting impedor $Z_3$ is an inherent element of the anti-PID device 140, and an impedance value of the current-limiting impedor $Z_3$ is also a known quantity. A voltage value of the common-mode voltage $U_g a$ obtained by dividing the preset common-mode voltage $U_{pid}$ by the alternating current grounding insulation impedance $Z_2$ can be measured by the voltage sampler 142, and is also a known quantity. In this case, the alternating current grounding insulation impedance $Z_2$ is the only unknown quantity that exists in the foregoing formula (1.3). Therefore, the impedance value of the alternating current grounding insulation impedance $Z_2$ can be calculated according to the foregoing formula (1.3).

Although the alternating current grounding insulation impedance can be detected by using the anti-PID device in the foregoing implementation, not all photovoltaic power generation systems are provided with the anti-PID device. In some photovoltaic power generation systems with limited costs and not very strict requirements for a service life of a solar cell, the anti-PID device is not disposed. In this case, this implementation is applicable only to a photovoltaic power generation system with an anti-PID device, and cannot be compatible with a photovoltaic power generation system without an anti-PID device. This extremely limits scenarios to which an alternating current grounding insulation impedance detection method is applicable. Consequently, commonality of the alternating current grounding insulation impedance detection method is relatively poor.

In view of this, this application provides an insulation impedance detection method, to detect the alternating current grounding insulation impedance by using a necessary device, namely, the inverter, in the photovoltaic power generation system, to ensure commonality of the alternating current grounding insulation impedance detection method when costs and complexity of alternating current grounding insulation impedance detection are reduced.

It should be understood that, the following embodiments are merely some of the embodiments of this application, rather than all the embodiments of this application. In the following descriptions, "at least one" means one or more, and "a plurality of" means two or more. In view of this, "a plurality of" may also be understood as "at least two" in the embodiments of the present invention. The term "and/or" describes an association relationship for describing associated objects and represents that three relationships may exist. For example, A and/or B may represent the following three cases: Only A exists, both A and B exist, and only B exists. In addition, the character "/" usually indicates an "or" relationship between the associated objects.

In addition, it should be understood that, in the description of this application, terms such as "first", "second", "third", and "fourth" are used only for purposes of distinguishing descriptions, and cannot be understood as indicating or implying relative importance, or as indicating or implying a sequence. For example, "first common-mode voltage", "second common-mode voltage", "third common-mode voltage", and "fourth common-mode voltage" are merely used to point out different common-mode voltages by using examples, and do not mean that importance degrees or priorities of the four common-mode voltages are different.

The following describes, by using specific embodiments, a specific implementation process of detecting the alternating current grounding insulation impedance.

Embodiment 1

Figure 3:
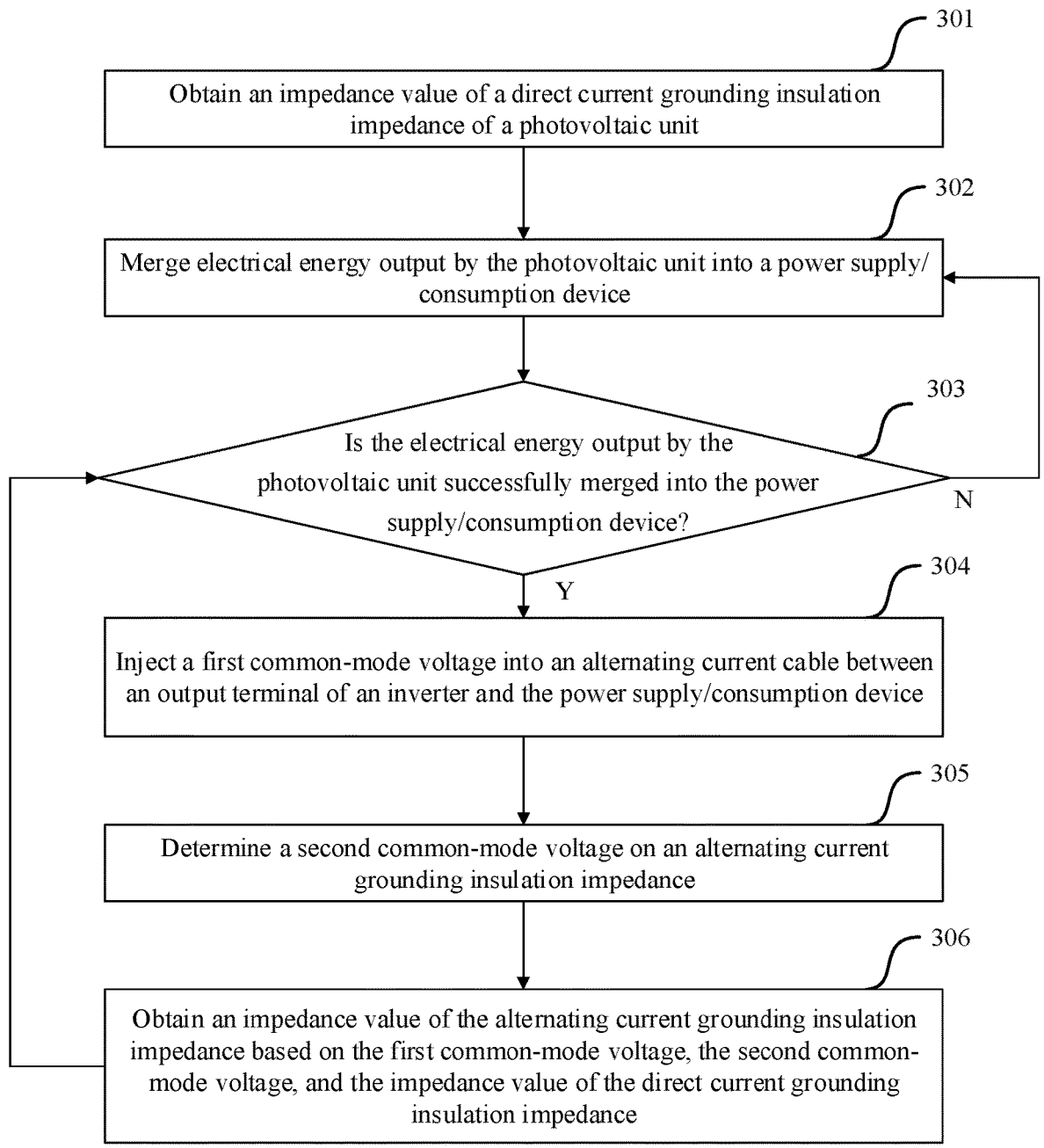
FIG. 3 is an example schematic flowchart of an insulation impedance detection method according to an embodiment of this application.

Based on the photovoltaic power generation system shown in FIG. 1, FIG. 3 is an example schematic flowchart of an insulation impedance detection method according to an embodiment of this application. This method is applicable to the inverter 120 shown in FIG. 1. In this example, considering that an impedance of a conductor inside an alternating current cable, an impedance of a conductor inside a photovoltaic unit, and an impedance of a grounding circuit are all relatively small, the inverter may directly ignore the impedances in a process of detecting an alternating current grounding insulation impedance. As shown in FIG. 3, the method includes the following operations.

Operation 301: The inverter obtains an impedance value of a direct current grounding insulation impedance of the photovoltaic unit.

Still refer to FIG. 1. In operation 301, the photovoltaic unit 110 further has the direct current grounding insulation impedance $Z_1$. The direct current grounding insulation impedance $Z_1$ is not an impedor that actually exists, and instead, is a virtual impedor configured to represent a degree of insulation between the conductor inside the photovoltaic unit 110 and ground. An impedance value of the virtual impedor is related to a material, a thickness, a temperature, humidity, and the like of an insulation medium wrapping the conductor inside the photovoltaic unit 110. Generally, when electrical conductivity of the insulation medium wrapping the conductor inside the photovoltaic unit 110 is lower, the thickness of the insulation medium is larger, the temperature of the insulation medium is lower, or the humidity of the insulation medium is lower, the impedance value of the direct current grounding insulation impedance $Z_1$ is larger. This means that insulation performance between the conductor inside the photovoltaic unit 110 and ground is better, and a possibility of electric leakage or short-circuit grounding of the photovoltaic unit 110 is lower. When the electrical conductivity of the insulation medium wrapping the conductor inside the photovoltaic unit 110 is higher, the thickness of the insulation medium is smaller, the temperature of the insulation medium is higher, or the humidity of the insulation medium is higher, the impedance value of the direct current grounding insulation impedance $Z_1$ is smaller. This means that insulation performance between the conductor inside the photovoltaic unit 110 and ground is poorer, and the possibility of electric leakage or short-circuit grounding of the photovoltaic unit 110 is higher.

In this embodiment of this application, the impedance value of the direct current grounding insulation impedance $Z_1$ of the photovoltaic unit 110 may be detected by the inverter 120 based on electrical characteristic parameters output by the photovoltaic unit 110, or may be detected by another device in the photovoltaic power generation system based on the electrical characteristic parameters output by the photovoltaic unit 110 and sent to the inverter 120, or may be detected by a dedicated detection device additionally disposed in the photovoltaic power generation system and sent to the inverter 120. This is not specifically limited. When the another device or the dedicated detection device performs detection, the another device or the dedicated detection device may perform detection before the inverter 120 is powered on, and send the detected impedance value to the inverter 120 after the inverter 120 is powered on. When the impedance value of the direct current grounding insulation impedance $Z_1$ is detected by the inverter 120, the inverter 120 may perform detection at any moment before merging electrical energy in a direct current form from the photovoltaic unit 110 into a power supply/consumption device 130. For example, the inverter 120 performs detection before receiving the electrical energy in the direct current form from the photovoltaic unit 110, or performs detection after receiving the electrical energy in the direct current form from the photovoltaic unit 110 and before converting the electrical energy in the direct current form into electrical energy in an alternating current form, or performs detection after receiving the electrical energy in the direct current form from the photovoltaic unit 110 and converting the electrical energy in the direct current form into the electrical energy in the alternating current form and before merging the electrical energy in the alternating current form obtained through conversion into the power supply/consumption device 130. In this way, when the inverter 120 performs a detection operation on the direct current grounding insulation impedance $Z_1$, a transmission link among the photovoltaic unit 110, the inverter 120, and the power supply/consumption device 130 is in a disconnected state, and the electrical energy generated by the photovoltaic unit 110 can be transmitted only among the photovoltaic unit 110, direct current cables (for example, a direct current cable $L_1$ and a direct current cable $L_2$) between the photovoltaic unit 110 and the inverter 120, the inverter 120, and the grounding circuit.

Figure 4:
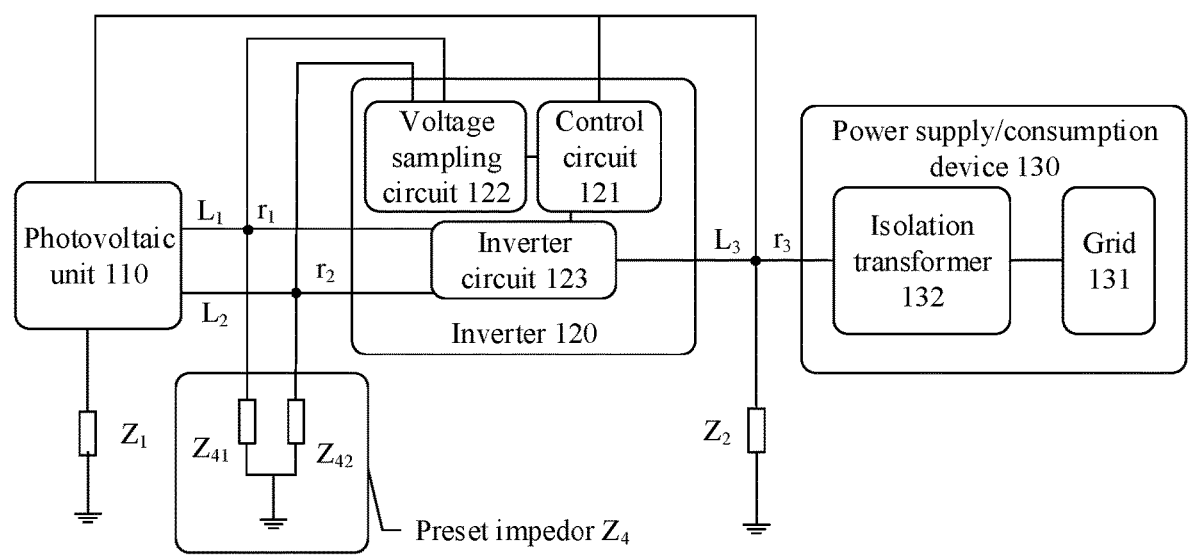
FIG. 4 is an example diagram of a circuit structure for detecting a direct current grounding insulation impedance by an inverter according to an embodiment of this application.

FIG. 4 is an example diagram of a circuit structure for detecting a direct current grounding insulation impedance by an inverter according to an embodiment of this application. As shown in FIG. 4, in this example, a control circuit 121 and a voltage sampling circuit 122 may be disposed in the inverter 120. Sampling points are disposed on the direct current cables between the photovoltaic unit 110 and the inverter 120 (for example, a sampling point $r_1$ on the direct current cable $L_1$ and a sampling point $r_2$ on the direct current cable $L_2$). The sampling point is connected to the grounding circuit by using a preset impedor $Z_4$. An input terminal of the voltage sampling circuit 122 is separately connected to the sampling point and the photovoltaic unit 110, and an output terminal of the voltage sampling circuit 122 is connected to the control circuit 121. When the direct current grounding insulation impedance $Z_1$ is detected, the control circuit 121 may separately obtain a first voltage (assumed to be $U_1$) on a side of the photovoltaic unit 110 and a second voltage (assumed to be $U_4$) at the sampling point by using the voltage sampling circuit 122. Because the electrical energy output by the photovoltaic unit 110 is not merged into the power supply/consumption device 130, under an effect of the first voltage $U_1$ on the side of the photovoltaic unit 110, a loop can be formed among the preset impedor $Z_4$, the grounding circuit, the direct current grounding insulation impedance $Z_1$, and the photovoltaic unit 110. When the impedance of the conductor inside the photovoltaic unit 110 is not considered, the first voltage $U_1$ is divided by the preset impedor $Z_4$ and the direct current grounding insulation impedance $Z_1$. The first voltage $U_1$ is equal to a sum of a voltage obtained by dividing the first voltage $U_1$ by the preset impedor $Z_4$ and a voltage obtained by dividing the first voltage $U_1$ by the direct current grounding insulation impedance $Z_1$. The second voltage $U_4$ that is sampled by the voltage sampling circuit 122 and that is on the direct current cable is a voltage obtained by dividing the first voltage $U_1$ by the preset impedor $Z_4$. In this way, the inverter can calculate the impedance value of the direct current grounding insulation impedance $Z_1$ based on the first voltage $U_1$, the second voltage $U_4$ obtained by dividing the first voltage $U_1$ by the preset impedor $Z_4$, and the impedance value of the preset impedor $Z_4$ and according to the following formula (2.1):

$$\frac{U_4}{U_1} = \frac{Z_4}{Z_1 + Z_4} \qquad (2.1)$$

In the foregoing formula (2.1), the second voltage $U_4$ may be sampled by the voltage sampling circuit 122, and is a known quantity. The preset impedor $Z_4$ is preset in the photovoltaic power generation system, and is also a known quantity. The first voltage $U_1$ and the direct current grounding insulation impedance $Z_1$ are both unknown quantities. There are two unknown quantities in this expression. If the impedance value of the direct current grounding insulation impedance $Z_1$ needs to be calculated, another expression further needs to be listed. In this case, the preset impedor $Z_4$ may be set to an adjustable impedor. During implementation, the inverter may first adjust the preset impedor $Z_4$ to a particular impedance value, and an expression is listed based on the impedance value and the detected second voltage $U_4$ and according to the foregoing formula (2.1). Then, the preset impedor $Z_4$ is adjusted to another impedance value. Then another expression is listed based on the another impedance value and the detected second voltage $U_4$ and according to the foregoing formula (2.1). In this way, after the first voltage $U_1$ is reduced according to the two expressions, the inverter can calculate the impedance value of the direct current grounding insulation impedance $Z_1$.

For example, when the direct current cables include the direct current cable $L_1$ and the direct current cable $L_2$ shown in FIG. 4, the preset impedor $Z_4$ may also include an impedor $Z_{41}$ and an impedor $Z_{42}$ shown in FIG. 4. The sampling point $r_1$ on the direct current cable $L_1$ is connected to the grounding circuit by using the impedor $Z_{41}$. The sampling point $r_2$ on the direct current cable $L_2$ is connected to the grounding circuit by using the impedor $Z_{42}$. The voltage sampling circuit 122 is separately connected to the sampling point $r_1$ and the sampling point $r_2$. When the electrical energy output by the photovoltaic unit 110 is not merged into a grid 131, the impedor $Z_{41}$ and the impedor $Z_{42}$ are in a relationship of parallel connection. In this case:

The control circuit 121 may first adjust the impedance value of the preset impedor $Z_4$ to a particular impedance value, and obtain a voltage (assumed to be $U_{41}$) at the sampling point $r_1$ by using the voltage sampling circuit 122. The voltage $U_{41}$ is actually a common-mode voltage on the direct current cable $L_1$. The common-mode voltage $U_{41}$ is provided for the impedor $Z_{41}$ as the second voltage obtained by dividing the first voltage $U_1$ by the impedor $Z_{41}$. After the direct current grounding insulation impedance $Z_1$ is connected in parallel to the impedor $Z_{42}$, the first voltage $U_1$ is divided to obtain another part of voltage. In this way, the inverter may list an expression based on the first voltage $U_1$, the second voltage $U_{41}$ obtained by dividing the first voltage $U_1$ by the impedor $Z_{41}$, the direct current grounding insulation impedance $Z_1$, the impedance value of the impedor $Z_{41}$, and the impedance value of the impedor $Z_{42}$ and according to the following formula (2.2.1):

$$\frac{U_{41}}{U_1} = \frac{Z_{41}}{\frac{Z_1 \times Z_{42}}{Z_1 + Z_{42}} + Z_{41}} \qquad (2.2.1)$$

Further, the control circuit 121 may further adjust the impedance value of the preset impedor $Z_4$ to a particular impedance value, and obtain a voltage (assumed to be $U_{42}$) at the sampling point $r_2$ by using the voltage sampling circuit 122. The voltage $U_{42}$ is actually a common-mode voltage on the direct current cable $L_2$. The common-mode voltage $U_{42}$ is provided for the impedor $Z_{42}$ as the second voltage obtained by dividing the first voltage $U_1$ by the impedor $Z_{42}$. After the direct current grounding insulation impedance $Z_1$ is connected in parallel to the impedor $Z_{41}$, the first voltage $U_1$ is divided to obtain another part of voltage. In this way, the inverter may list another expression based on the first voltage $U_1$, the second voltage $U_{42}$ obtained by dividing the first voltage $U_1$ by the impedor $Z_{42}$, the direct current grounding insulation impedance $Z_1$, the impedance value of the impedor $Z_{41}$, and the impedance value of the impedor $Z_{42}$ and according to the following formula (2.2.2):

$$\frac{U_{42}}{U_1} = \frac{Z_{42}}{\frac{Z_1 \times Z_{41}}{Z_1 + Z_{41}} + Z_{42}} \qquad (2.2.2)$$

In this way, a total of two unknown quantities: the first voltage $U_1$ and the direct current grounding insulation impedance $Z_1$ exist in the foregoing formulas (2.2.1) and (2.2.2). After reducing the first voltage $U_1$ according to the two expressions, the inverter can calculate the impedance value of the direct current grounding insulation impedance $Z_1$.

It should be noted that, the foregoing content merely describes a possible detection manner by using an example. That the direct current grounding insulation impedance $Z_1$ can be detected only in this manner is not limited in this application. For example, in another example, the impedance value of the direct current grounding insulation impedance $Z_1$ may alternatively be measured in an insulation ISO test manner before the inverter is powered on, or an average value of a plurality of impedance values acquired through a plurality of experiments is used as the impedance value of the direct current grounding insulation impedance $Z_1$, and so on.

Operation 302: The inverter merges electrical energy output by the photovoltaic unit into the power supply/consumption device.

Still refer to FIG. 4. The inverter 120 may further include an inverter circuit 123. An input terminal of the inverter circuit 123 is connected to the photovoltaic unit 110. An output terminal of the inverter circuit 123 is connected to the power supply/consumption device 130. A control terminal of the inverter circuit 123 is connected to the control circuit 121. In this case, that the inverter 120 merges the electrical energy output by the photovoltaic unit 110 into the power supply/consumption device 130 means that: The inverter circuit 123 receives the electrical energy in the direct current form from the photovoltaic unit 110 under control of the control circuit 121, and converts the electrical energy in the direct current form into electrical energy in an alternating current form, and outputs the electrical energy in the alternating current form to the power supply/consumption device 130.

Operation 303: The inverter determines whether the electrical energy output by the photovoltaic unit is successfully merged into the power supply/consumption device. If the electrical energy output by the photovoltaic unit is successfully merged into the power supply/consumption device, operation 304 is performed, and if the electrical energy output by the photovoltaic unit is not successfully merged into the power supply/consumption device, operation 302 is performed.

In an optional implementation, after being powered on, the inverter 120 may not first merge the electrical energy output by the photovoltaic unit 110 into the power supply/consumption device 130, and instead, first detect the impedance value of the direct current grounding insulation impedance $Z_1$ of the photovoltaic unit 110, and merge the electrical energy output by the photovoltaic unit 110 into the power supply/consumption device 130 after detection ends, and monitor a merging result in real time. When merging does not succeed, the inverter 120 may perform a merging operation repeatedly (that is, perform operation 302 and operation 303 repeatedly), until monitoring merging success, and then the inverter starts to periodically detect the impedance value of the alternating current grounding insulation impedance $Z_2$. The following describes how to detect the impedance value of the alternating current grounding insulation impedance $Z_2$ by using one period as an example.

Operation 304: The inverter injects a first common-mode voltage into the alternating current cable between an output terminal of the inverter and the power supply/consumption device.

Still refer to FIG. 4. In operation 304 the control circuit 121 may send, to the inverter circuit 123, indication information of injecting the first common-mode voltage, to indicate the inverter circuit 123 to inject the first common-mode voltage (assumed to be $U_{gm1}$) into the alternating current cable $L_3$. For example, the control circuit 121 may be further connected to an external terminal device, for example, a notebook computer, a mobile phone, or an embedded device. An application (application, APP) is installed on the external terminal device. In this way, a user may further control a voltage characteristic of the injected first common-mode voltage $U_{gm1}$ by using the APP software on the external terminal device, for example, control a frequency, a phase, or an amplitude of the injected first common-mode voltage $U_{gm1}$.

In this embodiment of this application, when the power supply/consumption device 130 includes an isolation transformer 132 and the grid 131, the grid 131 may be a balanced grid. In this case, that the electrical energy output by the photovoltaic unit 110 is merged into the grid 131 means that a differential mode voltage output by the photovoltaic unit 110 is completely merged into the grid 131 after being converted by the inverter. The first common-mode voltage $U_{gm1}$ injected by the inverter into the alternating current cable $L_3$ enables a loop to be formed among the alternating current cable $L_3$, the alternating current grounding insulation impedance $Z_2$, the grounding circuit, the direct current grounding insulation impedance $Z_1$, the photovoltaic unit 110, and the inverter 120.

Operation 305: The inverter determines a second common-mode voltage on the alternating current grounding insulation impedance.

Still refer to FIG. 4. In an optional implementation, a sampling point $r_3$ is disposed on the alternating current cable $L_3$. The voltage sampling circuit 122 is further connected to the sampling point $r_3$. In this way, the control circuit 121 may further obtain a common-mode voltage at the sampling point $r_3$ by using the voltage sampling circuit 122. The common-mode voltage is the second common-mode voltage on the alternating current grounding insulation impedance $Z_2$. When the impedance of the conductor inside the alternating current cable $L_3$, the impedance of the grounding circuit, the impedance of the conductor inside the photovoltaic unit 110, and an impedance of a conductor inside the inverter 120 are not considered, the first common-mode voltage $U_{gm1}$ is provided only for the alternating current grounding insulation impedance $Z_2$ and the direct current grounding insulation impedance $Z_1$. In this case, the first common-mode voltage $U_{gm1}$ is divided by the alternating current grounding insulation impedance $Z_2$ and the direct current grounding insulation impedance $Z_1$. The first common-mode voltage $U_{gm1}$ is equal to a sum of a voltage on the alternating current grounding insulation impedance $Z_2$ and a voltage on the direct current grounding insulation impedance $Z_1$. The common-mode voltage at the sampling point $r_3$ is the second common-mode voltage (assumed to be $U_{gm2}$) obtained by dividing the first common-mode voltage $U_{gm1}$ by the alternating current grounding insulation impedance $Z_2$.

Operation 306: The inverter obtains an impedance value of the alternating current grounding insulation impedance based on the first common-mode voltage, the second common-mode voltage, and the impedance value of the direct current grounding insulation impedance.

In operation 306 the inverter may obtain the impedance value of the alternating current grounding insulation impedance in any one of the following manners:

Manner 1:

The control circuit 121 can calculate the impedance value of the alternating current grounding insulation impedance $Z_2$ based on the first common-mode voltage $U_{gm1}$, the second common-mode voltage $U_{gm2}$ obtained by dividing the first common-mode voltage $U_{gm1}$ by the alternating current grounding insulation impedance $Z_2$, and the impedance value of the direct current grounding insulation impedance $Z_1$ and according to the following formula (2.3):

$$\frac{U_{gm2}}{U_{gm1}} = \frac{Z_2}{Z_1 + Z_2} \qquad (2.3)$$

In the foregoing formula (2.3), the control circuit 121 controls the inverter circuit 123 to inject the first common-mode voltage $U_{gm1}$ into the alternating current cable $L_3$. A voltage value of the first common-mode voltage $U_{gm1}$ is a known quantity. The second common-mode voltage $U_{gm2}$ can be sampled by using the voltage sampling circuit 122. A voltage value of the second common-mode voltage $U_{gm2}$ is also a known quantity. The direct current grounding insulation impedance $Z_1$ is detected in advance before the inverter 120 merges the electrical energy output by the photovoltaic unit 110 into the power supply/consumption device 130. The impedance value of the direct current grounding insulation impedance $Z_1$ is also a known quantity. In this case, only one unknown quantity, namely, the impedance value of the alternating current grounding insulation impedance $Z_2$ is actually included in the foregoing formula (2.3). In this way, the inverter can calculate the impedance value of the alternating current grounding insulation impedance $Z_2$ after substituting the known quantities into the foregoing formula (2.3).

Manner 2:

The control circuit 121 may first calculate a third common-mode voltage $U_{gm3}$ obtained by dividing the first common-mode voltage $U_{gm1}$ by the direct current grounding insulation impedance $Z_1$ based on the first common-mode voltage $U_{gm1}$, and the second common-mode voltage $U_{gm2}$ obtained by dividing the first common-mode voltage $U_{gm1}$ by the alternating current grounding insulation impedance $Z_2$ and according to the following formula (2.4):

$$U_{gm3} = U_{gm1} - U_{gm2} \quad (2.4)$$

Subsequently, the control circuit 121 can calculate a value of a current flowing through the direct current grounding insulation impedance $Z_1$ based on the third common-mode voltage $U_{gm3}$ obtained by dividing the first common-mode voltage $U_{gm1}$ by the direct current grounding insulation impedance $Z_1$ and the impedance value of the direct current grounding insulation impedance $Z_1$ that is detected in advance, and can calculate a value of a current flowing through the alternating current grounding insulation impedance $Z_2$ based on the second common-mode voltage $U_{gm2}$ obtained by dividing the first common-mode voltage $U_{gm1}$ by the alternating current grounding insulation impedance $Z_2$ and the alternating current grounding insulation impedance $Z_2$. Because the direct current grounding insulation impedance $Z_1$ is connected in series to the alternating current grounding insulation impedance $Z_2$, the two current values remain consistent. To be specific, the following formula (2.5) is satisfied:

$$\frac{U_{gm3}}{Z_1} = \frac{U_{gm2}}{Z_2} \quad (2.5)$$

In this way, the control circuit can calculate the impedance value of the alternating current grounding insulation impedance $Z_2$ by substituting the known quantities into the foregoing formulas (2.4) and (2.5).

Manner 3:

The control circuit 121 can calculate a value of a current flowing through the alternating current grounding insulation impedance $Z_2$ based on the second common-mode voltage $U_{gm2}$ obtained by dividing the first common-mode voltage $U_{gm1}$ by the alternating current grounding insulation impedance $Z_2$ and the alternating current grounding insulation impedance $Z_2$, and can calculate a value of a current flowing through the entire loop based on the first common-mode voltage $U_{gm1}$, the impedance value of the direct current grounding insulation impedance $Z_1$ that is detected in advance, and the alternating current grounding insulation impedance $Z_2$. Because the direct current grounding insulation impedance $Z_1$ is connected in series to the alternating current grounding insulation impedance $Z_2$, the two current values remain consistent. To be specific, the following formula (2.6) is satisfied:

$$\frac{U_{gm2}}{Z_2} = \frac{U_{gm1}}{Z_1 + Z_2} \quad (2.6)$$

In this way, the control circuit can calculate the impedance value of the alternating current grounding insulation impedance $Z_2$ by substituting the known quantities into the foregoing formula (2.6).

In an optional implementation, after detecting the impedance value of the alternating current grounding insulation impedance $Z_2$ each time, the inverter 120 may further compare the detected impedance value of the alternating current grounding insulation impedance $Z_2$ with a preset impedance threshold. If it is found that the detected impedance value of the alternating current grounding insulation impedance $Z_2$ is less than the preset impedance threshold, it indicates that insulation performance between the alternating current cable $L_3$ and ground is relatively poor, and the photovoltaic power generation system currently is at risk of electric leakage or short-circuit grounding. In this case, the inverter 120 may not merge the electrical energy output by the photovoltaic unit 110 into the power supply/consumption device 130 any more, and may issue an alarm to a user, for example, generate an alarm message and send the alarm message to the connected external terminal device in real time, so that the user identifies an abnormality of the alternating current grounding insulation impedance $Z_2$ in a timely manner, repairs the alternating current cable $L_3$ as soon as possible, and maintains reliability of the photovoltaic power generation system. If it is found that the detected impedance value of the alternating current grounding insulation impedance $Z_2$ is not less than the preset impedance threshold, it indicates that the insulation performance between the alternating current cable $L_3$ and ground is relatively good, and the photovoltaic power generation system is currently not at risk of electric leakage or short-circuit grounding. The inverter 120 does not need to issue an alarm, and may start a detection operation of a next period.

In the foregoing Embodiment 1, the inverter uses the common-mode voltage injected into the alternating current cable as an excitation source. By detecting the impedance value of the direct current grounding insulation impedance in advance and measuring and extracting the common-mode voltage divided by the alternating current grounding insulation impedance under the excitation source, the impedance value of the alternating current grounding insulation impedance can be calculated by using voltage division values of the common-mode voltage on the alternating current grounding insulation impedance and the direct current grounding insulation impedance. In this manner, the necessary device, namely, the inverter in the photovoltaic power generation system is used to detect the alternating current grounding insulation impedance, so that an additional detection device does not need to be disposed, and complex logic calculation is not required, to help ensure commonality and implementation convenience of the detection method when costs and complexity of alternating current grounding insulation impedance detection are reduced.

The following further describes a process of paring the alternating current grounding insulation impedance $Z_2$ by using the foregoing formula (2.3) as an example.

In this embodiment of this application, the alternating current grounding insulation impedance $Z_2$ may include one or more parameters in three parameters: alternating current grounding insulation impedance, alternating current grounding insulation capacitance, and alternating current grounding insulation reactance. For example, when the power supply/consumption device is a power consumption device (for example, a loading device 133 shown in FIG. 1), the alternating current grounding insulation impedance $Z_2$ usually includes the three parameters: the alternating current grounding insulation impedance, the alternating current grounding insulation capacitance, and the alternating current grounding insulation reactance. When the power supply/consumption device is a power supply device (for example, the isolation transformer 132 and the grid 131 shown in FIG. 1), the alternating current grounding insulation impedance $Z_2$ usually includes the two parameters: the alternating current grounding insulation impedance and the alternating current grounding insulation capacitance. When only one of the three parameters is included, the impedance value calculated by the inverter according to the foregoing formula (2.3) is a parameter value corresponding to the parameter, for example, an impedance value of the alternating current grounding insulation impedance, a capacitance value of the alternating current grounding insulation capacitance, or a reactance value of the alternating current grounding insulation reactance. When at least two parameters of the three parameters are included, the inverter cannot calculate parameter values respectively corresponding to the at least two parameters only according to the foregoing formula (2.3). In this case, the inverter 120 further needs to change the voltage characteristic of the first common-mode voltage $U_{gm1}$ injected into the alternating current cable $L_3$, and construct at least two formulas according to the foregoing formula (2.3), to calculate the parameter values respectively corresponding to the at least two parameters by using the at least two formulas. When a voltage type of the first common-mode voltage $U_{gm1}$ varies, the voltage characteristic of the first common-mode voltage $U_{gm1}$ also varies. The following describes how to calculate the parameter values of the parameters included in the alternating current grounding insulation impedance $Z_2$ for first common-mode voltages $U_{gm1}$ of different voltage types by using example 1 and example 2 as examples.

Example 1

When the first common-mode voltage $U_{gm1}$ is a voltage in an alternating current form, the inverter 120 may generate formulas whose quantity is the same as a quantity of the parameters included in the alternating current grounding insulation impedance $Z_2$ by changing one or more of the voltage characteristics: the frequency, the amplitude, or the phase of the first common-mode voltage $U_{gm1}$. The following provides description by using an example of changing the frequency of the first common-mode voltage $U_{gm1}$:

When the alternating current grounding insulation impedance $Z_2$ includes only one of the parameters: the alternating current grounding insulation impedance, the alternating current grounding insulation capacitance, or the alternating current grounding insulation reactance, the inverter 120 may inject only the first common-mode voltage of a first frequency into the alternating current cable $L_3$. Then, after obtaining a common-mode voltage (for example, a fourth common-mode voltage) on the alternating current cable $L_3$ by using the voltage sampling circuit 122, the inverter 120 extracts, from the fourth common-mode voltage, a common-mode voltage having the first frequency as the second common-mode voltage $U_{gm2}$ (the extraction operation may be performed by the voltage sampling circuit 122 or by the control circuit 121, and this is not limited). The first common-mode voltage $U_{gm1}$ of the first frequency and the second common-mode voltage $U_{gm2}$ of the first frequency are substituted into the foregoing formula (2.3), to calculate a parameter value of one parameter included in the alternating current grounding insulation impedance $Z_2$. The inverter may extract the second common-mode voltage $U_{gm2}$ of the first frequency from the fourth common-mode voltage in a plurality of manners, for example, by using fast Fourier transform (fast Fourier transform, FFT).

When the alternating current grounding insulation impedance $Z_2$ includes two of the parameters: the alternating current grounding insulation impedance, the alternating current grounding insulation capacitance, and the alternating current grounding insulation reactance (for example, the alternating current grounding insulation impedance and the alternating current grounding insulation capacitance), the inverter 120 may inject common-mode voltages including a first frequency and a second frequency into the alternating current cable $L_3$ at a time, and then, after obtaining the fourth common-mode voltage on the alternating current cable $L_3$ by using the voltage sampling circuit 122, the inverter 120 separately extracts a common-mode voltage having the first frequency and a common-mode voltage having the second frequency from the fourth common-mode voltage, substitutes the common-mode voltage of the first frequency (used as the first common-mode voltage $U_{gm1}$) included in the injected common-mode voltages and the common-mode voltage of the first frequency (used as the second common-mode voltage $U_{gm2}$) extracted from the fourth common-mode voltage into the foregoing formula (2.3), to obtain a first association relationship between the alternating current grounding insulation impedance and the alternating current grounding insulation capacitance, and substitutes the common-mode voltage of the second frequency (used as the first common-mode voltage $U_{gm1}$) included in the injected common-mode voltages and the common-mode voltage of the second frequency (used as the second common-mode voltage $U_{gm2}$) extracted from the fourth common-mode voltage into the foregoing formula (2.3), to obtain a second association relationship between the alternating current grounding insulation impedance and the alternating current grounding insulation capacitance. By parsing the two association relationships, the inverter 120 can calculate the impedance value of the alternating current grounding insulation impedance included in the alternating current grounding insulation impedance $Z_2$ and the capacitance value of the alternating current grounding insulation capacitance included in the alternating current grounding insulation impedance $Z_2$.

It should be noted that, the foregoing manner is described merely by using an example in which the common-mode voltages including a plurality of frequencies are injected at a time. In another example, the inverter may alternatively separately inject common-mode voltages of different frequencies at a plurality of times, and calculate the parameter values of the foregoing plurality of parameters in combination with a plurality of expressions constructed through injection at the plurality of times. Details are not repeated in this application.

When the alternating current grounding insulation impedance $Z_2$ includes the three parameters: the alternating current grounding insulation impedance, the alternating current grounding insulation capacitance, and the alternating current grounding insulation reactance, the inverter 120 may first inject the first common-mode voltage $U_{gm1}$ of a first frequency into the alternating current cable $L_3$, and acquire and extract the second common-mode voltage $U_{gm2}$ having the first frequency in the foregoing manner, and substitute the first common-mode voltage $U_{gm1}$ of the first frequency and the second common-mode voltage $U_{gm2}$ of the first frequency into the foregoing formula (2.3), to obtain a first association relationship among the alternating current grounding insulation impedance, the alternating current grounding insulation capacitance, and the alternating current grounding insulation reactance; then, the inverter 120 may further inject the first common-mode voltage $U_{gm1}$ of a second frequency into the alternating current cable $L_3$, and acquire and extract the second common-mode voltage $U_{gm2}$ having the second frequency in the foregoing manner, and substitute the first common-mode voltage $U_{gm1}$ of the second frequency and the second common-mode voltage $U_{gm2}$ of the second frequency into the foregoing formula (2.3), to obtain a second association relationship among the alternating current grounding insulation impedance, the alternating current grounding insulation capacitance, and the alternating current grounding insulation reactance; next, the inverter 120 may further inject the first common-mode voltage $U_{gm1}$ of a third frequency into the alternating current cable $L_3$, and acquire and extract the second common-mode voltage $U_{gm2}$ having the third frequency in the foregoing manner, and substitute the first common-mode voltage $U_{gm1}$ of the third frequency and the second common-mode voltage $U_{gm2}$ of the third frequency into the foregoing formula (2.3), to obtain a third association relationship among the alternating current grounding insulation impedance, the alternating current grounding insulation capacitance, and the alternating current grounding insulation reactance. By parsing the three association relationships, the inverter 120 can calculate the impedance value of the alternating current grounding insulation impedance included in the alternating current grounding insulation impedance $Z_2$, the capacitance value of the alternating current grounding insulation capacitance included in the alternating current grounding insulation impedance $Z_2$, and the reactance value of the alternating current grounding insulation reactance included in the alternating current grounding insulation impedance $Z_2$. It should be noted that, this manner is described merely by using an example in which the first common-mode voltages of different frequencies are injected at a plurality of times. In another example, the inverter may alternatively inject common-mode voltages including a plurality of frequencies at a time, and calculate the parameter values of the foregoing plurality of parameters in combination with a plurality of expressions respectively constructed through injection of the common-mode voltages of the plurality of frequencies. Details are not repeated in this application.

It should be understood that, the foregoing example 1 describes how to calculate the parameter values of the parameters included in the alternating current grounding insulation impedance $Z_2$ merely by using an example of changing the voltage characteristic, namely, the frequency of the first common-mode voltage $U_{gm1}$. When the alternating current grounding insulation impedance $Z_2$ includes at least two parameters, the inverter may alternatively construct expressions whose quantity is the same as a quantity of the parameters by changing at least two of the three voltage characteristics: the frequency, the amplitude, and the phase. Details are not repeated in this application.

Example 2

When the first common-mode voltage $U_{gm1}$ is a voltage in a direct current form, because the voltage in the direct current form does not have the frequency and the alternating current grounding insulation capacitance and the alternating current grounding insulation reactance are both related to the frequency, the alternating current grounding insulation impedance $Z_2$ includes only the alternating current grounding insulation impedance, and does not include the alternating current grounding insulation capacitance and the alternating current grounding insulation reactance. In this case, the inverter 120 may directly inject the first common-mode voltage $U_{gm1}$ with a preset amplitude and a preset phase into the alternating current cable $L_3$, and then obtain the second common-mode voltage $U_{gm2}$ on the alternating current cable $L_3$ by using the voltage sampling circuit 122, and substitute the first common-mode voltage $U_{gm1}$ and the second common-mode voltage $U_{gm2}$ into the foregoing formula (2.3), to calculate the impedance value of the alternating current grounding insulation impedance included in the alternating current grounding insulation impedance $Z_2$.

In an optional implementation, to avoid a problem that precision of single calculation is not high, the inverter 120 may further change the phase and the amplitude randomly or according to a preset rule, to perform calculation for a plurality of times, and then select, based on calculation results of the calculation for the plurality of times, a calculation result with relatively high precision as the final impedance value. For example, the inverter 120 may further first apply a positive first common-mode voltage with a particular amplitude to an alternating current side, and after calculating the impedance value of the alternating current grounding insulation impedance $Z_2$ corresponding to the positive first common-mode voltage based on the detected second common-mode voltage, the inverter 120 then applies a negative first common-mode voltage with the same amplitude to the alternating current side, and calculates the impedance value of the alternating current grounding insulation impedance $Z_2$ corresponding to the negative first common-mode voltage based on the detected second common-mode voltage. If a difference between the two impedance values corresponding to the positive first common-mode voltage and the negative first common-mode voltage is not large, it indicates that precision of current calculation is relatively high, and the inverter 120 may select one of the two impedance values as the final impedance value, or may use an average value or a weighted average value of the two impedance values as the final impedance value, and so on. If the difference between the two impedance values corresponding to the positive first common-mode voltage and the negative first common-mode voltage is relatively large, it indicates that the precision of current calculation is not high, and the inverter 120 may further apply positive and negative first common-mode voltages with another amplitude again, and repeatedly perform the foregoing process, until impedance values with a calculation result difference therebetween that is not large are found, to improve calculation precision.

In this embodiment of this application, the inverter 120 may be connected to the power supply/consumption device 130 by using a single-phase alternating current cable, or may be connected to the power supply/consumption device 130 by using a three-phase alternating current cable. When the inverter 120 is connected to the power supply/consumption device 130 by using the single-phase alternating current cable, the alternating current grounding insulation impedance $Z_2$ is used to represent a degree of insulation between a conductor inside the single-phase alternating current cable and ground, and the inverter 120 may directly calculate the impedance value of the alternating current grounding insulation impedance $Z_2$ in the manner in the foregoing Embodiment 1. When the inverter 120 is connected to the power supply/consumption device 130 by using the three-phase alternating current cable, the alternating current grounding insulation impedance $Z_2$ actually includes three alternating current grounding insulation subimpedances respectively corresponding to the three-phase alternating current cable. The alternating current grounding insulation subimpedance corresponding to each phase of alternating current cable is used to represent a degree of insulation between a conductor inside the phase of alternating current cable and ground. The following describes how to calculate the alternating current grounding insulation impedance $Z_2$ corresponding to the three-phase alternating current cable by using Embodiment 2.

Embodiment 2

Figure 5:
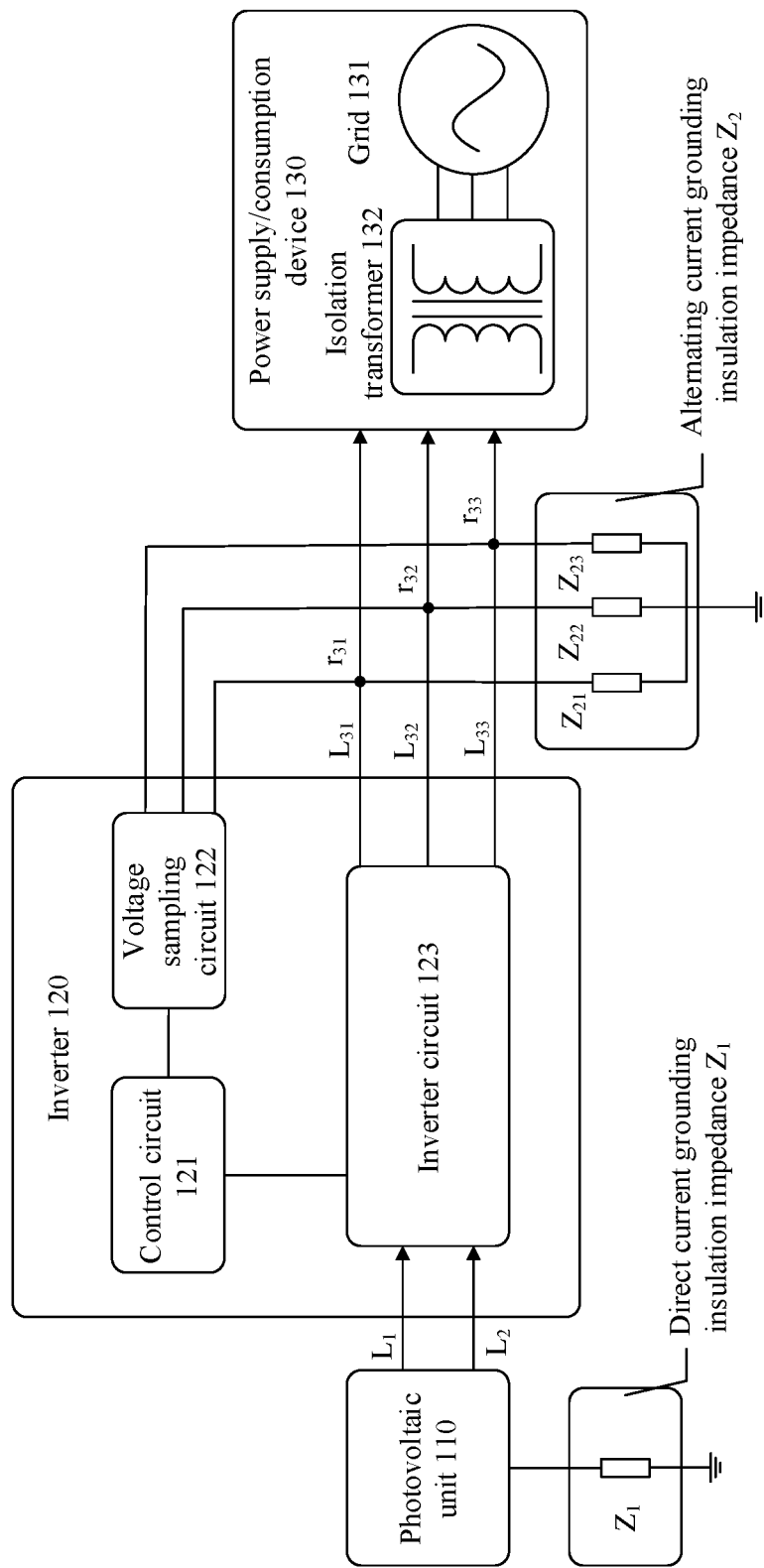
FIG. 5 is an example diagram of a circuit structure of another photovoltaic power generation system according to an embodiment of this application.

FIG. 5 is an example diagram of a circuit structure of another photovoltaic power generation system according to an embodiment of this application. As shown in FIG. 5, in this example, an inverter 120 is connected to a power supply/consumption device 130 by using three phases of alternating current cables: an alternating current cable $L_{31}$, an alternating current cable $L_{32}$, and an alternating current cable $L_{33}$. An alternating current grounding insulation impedance $Z_2$ includes an alternating current grounding insulation subimpedance $Z_{21}$ corresponding to the alternating current cable $L_{31}$, an alternating current grounding insulation subimpedance $Z_{22}$ corresponding to the alternating current cable $L_{32}$, and an alternating current grounding insulation subimpedance $Z_{23}$ corresponding to the alternating current cable $L_{32}$. Each phase of alternating current cable in the three phases of alternating current cables is connected to a grounding circuit by using the alternating current grounding insulation subimpedance corresponding to the phase of alternating current cable. For example, the alternating current cable $L_{31}$ leads out a cable at a sampling point $r_{31}$, to connect to one terminal of the alternating current grounding insulation subimpedance $Z_{21}$, and further connect to the grounding circuit by using the other terminal of the alternating current grounding insulation subimpedance $Z_{21}$. The alternating current cable $L_{32}$ leads out a cable at a sampling point $r_{32}$, to connect to one terminal of the alternating current grounding insulation subimpedance $Z_{22}$, and further connect to the grounding circuit by using the other terminal of the alternating current grounding insulation subimpedance $Z_{22}$. The alternating current cable $L_{33}$ leads out a cable at a sampling point $r_{33}$, to connect to one terminal of the alternating current grounding insulation subimpedance $Z_{23}$, and further connect to the grounding circuit by using the other terminal of the alternating current grounding insulation subimpedance $Z_{23}$. An input terminal of a voltage sampling circuit 122 in the inverter 120 is further separately connected to the sampling point $r_{31}$, the sampling point $r_{32}$, and the sampling point $r_{33}$. During implementation, after detecting that the inverter 120 is powered on, a control circuit 121 may not first send a starting instruction to an inverter circuit 123, to enable the inverter circuit 123 to continue to maintain a non-working state. Electrical energy output by a photovoltaic unit 110 is not merged into a grid 131. The control circuit 121 detects a direct current grounding insulation impedance $Z_1$ of the photovoltaic unit 110 based on electrical parameters of the photovoltaic unit 110 in a non-grid-connected state. Subsequently, the control circuit 121 sends the starting instruction to the inverter circuit 123, to enable the inverter circuit 123 to switch to a working state. In this case, the inverter circuit 123 can receive the electrical energy in a direct current form input by the photovoltaic unit 110, and convert the electrical energy in the direct current form into electrical energy in an alternating current form, which is then merged into the grid 131 by using the alternating current cable $L_{31}$, the alternating current cable $L_{32}$, and the alternating current cable $L_{33}$. Three alternating currents with a same frequency, a same amplitude, and phases that sequentially decrease by 120° are respectively transmitted on the alternating current cable $L_{31}$, the alternating current cable $L_{32}$, and the alternating current cable $L_{33}$. After determining that the photovoltaic unit 110 is successfully grid-connected, the control circuit 121 may send an injection instruction to the inverter circuit 123, to drive the inverter circuit 123 to inject a first common-mode voltage into the three-phase alternating current cable, and acquire a common-mode voltage (assumed to be $U_{21}$) at the sampling point $r_{31}$, a common-mode voltage (assumed to be $U_{22}$) at the sampling point $r_{32}$, and a common-mode voltage (assumed to be $U_{23}$) at the sampling point $r_{33}$ by using the voltage sampling circuit 122. The control circuit 121 can calculate a common-mode voltage on the three-phase alternating current cable based on the common-mode voltages acquired at the three sampling points and according to the following formula (2.7), where the common-mode voltage is a voltage $U_2$ obtained by dividing the first common-mode voltage by the alternating current grounding insulation impedance $Z_2$:

$$U_2 = \frac{U_{21} + U_{22} + U_{23}}{3} \tag{2.7}$$

Furthermore, the control circuit 121 can parse out an impedance value of the alternating current grounding insulation impedance $Z_2$ by combining the foregoing formula (2.7) with the foregoing formula (2.3), or by combining the foregoing formula (2.7) with the foregoing formula (2.4) and the foregoing formula (2.5), or by combining the foregoing formula (2.7) with the foregoing formula (2.6). However, the impedance value of the alternating current grounding insulation impedance $Z_2$ actually includes the alternating current grounding insulation subimpedance $Z_{21}$, the alternating current grounding insulation subimpedance $Z_{22}$, and the alternating current grounding insulation subimpedance $Z_{23}$ in a manner of parallel connection. In this case, an association relationship among the three subimpedances further satisfies the following formula (2.8):

$$Z_2 = \frac{1}{\frac{1}{Z_{21}} + \frac{1}{Z_{22}} + \frac{1}{Z_{23}}} \tag{2.8}$$

Three unknown parameters actually exist in the foregoing formula (2.8). If an impedance value of the alternating current grounding insulation subimpedance corresponding to each phase of alternating current cable needs to be calculated, at least three expressions need to be listed. In this case, the control circuit 121 may alternatively inject first common-mode voltages with different voltage characteristics at three times, and construct a corresponding expression based on the first common-mode voltage injected each time and a correspondingly acquired second common-mode voltage, and calculate impedance values of the alternating current grounding insulation subimpedances respectively corresponding to the three phases of alternating current cables according to the three expressions obtained through construction for three times. Alternatively, the control circuit 121 may further inject common-mode voltages including different voltage characteristics at a time, and construct a corresponding expression based on the first common-mode voltage with each voltage characteristic in the injected common-mode voltages and the second common-mode voltage with the corresponding voltage characteristic, and calculate the impedance values of the alternating current grounding insulation subimpedances respectively corresponding to the three phases of alternating current cables based on the plurality of expressions obtained through construction. When the control circuit 121 controls the inverter circuit 123 to inject the first common-mode voltage in a direct current form, the control circuit 121 may change two voltage characteristics: an amplitude and a phase, of the injected first common-mode voltage. When the control circuit 121 controls the inverter circuit 123 to inject the first common-mode voltage in an alternating current form, the control circuit 121 may change one or more of three voltage characteristics: a frequency, an amplitude, and a phase, of the injected first common-mode voltage. Refer to the foregoing Embodiment 1 for a specific implementation process of changing different voltage characteristics to construct different expressions. Details are not repeated herein again.

Furthermore, in this embodiment of this application, the alternating current grounding insulation subimpedance corresponding to each phase of alternating current cable may also include one or more of three parameters: alternating current grounding insulation subimpedance, alternating current grounding insulation subcapacitance, and alternating current grounding insulation subreactance. For example, when the power supply/consumption device is a power consumption device (for example, a loading device 133 shown in FIG. 1), the alternating current grounding insulation impedance $Z_2$ usually includes three parameters: alternating current grounding insulation impedance, alternating current grounding insulation capacitance, and alternating current grounding insulation reactance. When the power supply/consumption device is a power supply device (for example, an isolation transformer 132 and the grid 131 shown in FIG. 1), the alternating current grounding insulation impedance $Z_2$ usually includes two parameters: the alternating current grounding insulation impedance and the alternating current grounding insulation capacitance. When only one of the three parameters is included, the impedance value that is of the alternating current grounding insulation subimpedance corresponding to each phase of alternating current cable and that is calculated after the three expressions are constructed in the foregoing manner is a parameter value of the parameter. When at least two of the three parameters are included, only the impedance value of the alternating current grounding insulation subimpedance corresponding to each phase of alternating current cable can be calculated after the three expressions are constructed in the foregoing manner, but parameter values respectively corresponding to at least two unknown quantities included in the alternating current grounding insulation subimpedance cannot be calculated. In this case, the inverter further needs to continue to change the voltage characteristic of the first common-mode voltage injected into the alternating current cable $L_3$, to construct more expressions. For example, when the three alternating current grounding insulation subimpedances corresponding to the three phases of alternating current cables each include the two parameters: the alternating current grounding insulation subimpedance and the alternating current grounding insulation subcapacitance, at least six expressions need to be constructed to calculate an impedance value of the alternating current grounding insulation subimpedance included in the alternating current grounding insulation subimpedance corresponding to each phase of alternating current cable and a capacitance value of the alternating current grounding insulation subcapacitance included in each phase of alternating current grounding insulation subimpedance, that is, the voltage characteristic of the first common-mode voltage needs to be changed for at least six times. For example, common-mode voltages including six frequencies are injected at the same time, or first common-mode voltages of different frequencies are injected at six times.

For example, when the power supply/consumption device includes the grid, and the first common-mode voltage is a voltage in a direct current form, the three-phase alternating current cable is approximately short-circuited by the grid. In this case, the inverter may directly calculate, by using an expression constructed through one injection operation, a total impedance value including the alternating current grounding insulation subimpedance on the three phases of alternating current cables, and may not separately calculate the impedance value of the alternating current grounding insulation subimpedance on each phase of alternating current cable any more, to avoid repeatedly performing meaningless construction operations, thereby saving computing resources of the inverter.

It should be noted that, in both the foregoing Embodiment 1 and the foregoing Embodiment 2, how to measure the alternating current grounding insulation impedance is described by using an example in which the photovoltaic power generation system includes one photovoltaic unit and one inverter. During specific implementation, the photovoltaic power generation system may alternatively include at least two photovoltaic units and at least two inverters that are in a one-to-one correspondence with each other. The photovoltaic units are connected to a same power supply/consumption device by using respectively corresponding inverters.

It should be noted that, names of the foregoing information are merely examples. With evolution of communications technologies, the name of any foregoing information may be changed. However, regardless of how the names of the information change, provided that meanings of the information are the same as those of the information in this application, the information falls within the protection scope of this application.

The foregoing mainly describes the solutions provided in this application from a perspective of interaction between network elements. It may be understood that to implement the foregoing functions, each network element includes a corresponding hardware structure and/or software module for implementing each function. A person skilled in the art should easily be aware that, in combination with the units and algorithm operations in the examples described in the embodiments disclosed in this specification, the present invention may be implemented by hardware or a combination of hardware and computer software. Whether a function is executed by hardware or hardware driven by computer software depends on particular applications and design constraints of the technical solutions. A person skilled in the art may use different methods to implement the described functions for each particular application, but it should not be considered that the implementation goes beyond the scope of the present invention.

Based on the method provided in the embodiments of this application, this application further provides a photovoltaic power generation system, including the foregoing photovoltaic unit, inverter, and power supply/consumption device. The photovoltaic unit is configured to: convert photon energy into electrical energy in a direct current form, and then transmit the electrical energy to the inverter, the inverter converts the electrical energy in the direct current form into electrical energy in an alternating current form when determining that an alternating current grounding insulation impedance is not less than a preset impedance threshold, and then merges the electrical energy in the alternating current form into the power supply/consumption device, so that the power supply/consumption device receives the electrical energy in the alternating current form.

In an embodiment, the power supply/consumption device may be a power supply device, for example, may include an isolation transformer and a grid, where an input terminal of the isolation transformer is connected to an output terminal of the inverter, and an output terminal of the isolation transformer is connected to the grid.

In another embodiment, the power supply/consumption device may be a power consumption device, for example, may include a loading device.

According to the method provided in the embodiments of this application, this application further provides a computer-readable medium. The computer-readable medium stores program code. When the program code is run on a computer, the computer is enabled to perform the method in any one of the embodiments shown in FIG. 1 to FIG. 5.

According to the method provided in the embodiments of this application, this application further provides a computer program product. The computer program product includes computer program code. When the computer program code is run on a computer, the computer is enabled to perform the method in any one of the embodiments shown in FIG. 1 to FIG. 5.

According to the method provided in the embodiments of this application, this application further provides a chip, for example, a chip in an inverter. The chip is configured to perform the method in any one of the embodiments shown in FIG. 1 to FIG. 5.

A person skilled in the art should understand that the embodiments of this application may be provided as a method, a system, or a computer program product. Therefore, this application may use a form of hardware only embodiments, software only embodiments, or embodiments with a combination of software and hardware. In addition, this application may use a form of a computer program product that is implemented on one or more computer-usable storage media (including but not limited to a magnetic disk memory, a CD-ROM, an optical memory, and the like) that include computer-usable program code.

This application is described with reference to the flowcharts and/or block diagrams of the method, the device (system), and the computer program product according to this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of another programmable data processing device to generate a machine, so that the instructions executed by the computer or the processor of the another programmable data processing device generate an apparatus for implementing a specific function in one or more processes in the flowcharts and/or in one or more blocks in the block diagrams.

These computer program instructions may alternatively be stored in a computer-readable memory that can indicate a computer or another programmable data processing device to work in a specific manner, so that the instructions stored in the computer-readable memory generate an artifact that includes an instruction apparatus. The instruction apparatus implements a specific function in one or more processes in the flowcharts and/or in one or more blocks in the block diagrams.

These computer program instructions may alternatively be loaded onto a computer or another programmable data processing device, so that a series of operations and steps are performed on the computer or the another programmable device, thereby generating computer-implemented processing. Therefore, the instructions executed on the computer or the another programmable device provide operations for implementing a specified function in one or more processes in the flowcharts and/or in one or more blocks in the block diagrams.

Certainly, a person skilled in the art can make various modifications and variations to this application without departing from the protection scope of this application. This application is intended to cover these modifications and variations of this application provided that they fall within the scope of protection defined by the claims of this application and equivalent technologies thereof.

What is claimed is:

1. An insulation impedance detection method, applicable to an inverter, wherein an input terminal of the inverter is connected to a photovoltaic unit, the photovoltaic unit has a direct current grounding insulation impedance, an output terminal of the inverter is connected to a power supply/consumption device by using an alternating current cable, the alternating current cable has an alternating current grounding insulation impedance, and the method comprises:
   injecting, by the inverter, a first common-mode voltage into the alternating current cable, wherein the first common-mode voltage is equal to a sum of a voltage on the alternating current grounding insulation impedance and a voltage on the direct current grounding insulation impedance;
   obtaining, by the inverter, a second common-mode voltage on the alternating current grounding insulation impedance; and
   obtaining, by the inverter, an impedance value of the alternating current grounding insulation impedance based on the first common-mode voltage, the second common-mode voltage, and an impedance value of the direct current grounding insulation impedance, wherein the impedance value of the direct current grounding insulation impedance is obtained in the following manner:
   obtaining, by the inverter, the impedance value of the direct current grounding insulation impedance based on electrical characteristics output by the photovoltaic unit.

2. The method according to claim 1, wherein the photovoltaic unit is connected to the inverter by using a direct current cable, and the direct current cable is grounded by using a preset impedor; and
   the obtaining, by the inverter, the impedance value of the direct current grounding insulation impedance based on electrical characteristics output by the photovoltaic unit comprises:
   acquiring, by the inverter, a first voltage of the photovoltaic unit, wherein the first voltage is equal to a sum of a voltage on the preset impedor and the voltage on the direct current grounding insulation impedance;
   acquiring, by the inverter, a second voltage on the preset impedor; and
   obtaining, by the inverter, the impedance value of the direct current grounding insulation impedance based on the first voltage, the second voltage, and an impedance value of the preset impedor.

3. The method according to claim 1, wherein before the injecting, by the inverter, a first common-mode voltage into the alternating current cable, the method further comprises:
merging, by the inverter, electrical energy output by the photovoltaic unit into the power supply/consumption device.

4. The method according to claim 1, wherein the obtaining, by the inverter, an impedance value of the alternating current grounding insulation impedance based on the first common-mode voltage, the second common-mode voltage, and an impedance value of the direct current grounding insulation impedance comprises:
obtaining, by the inverter, a differential voltage between the first common-mode voltage and the second common-mode voltage as a third common-mode voltage on the direct current grounding insulation impedance;
obtaining, by the inverter, a ratio of the second common-mode voltage to the third common-mode voltage as a voltage division ratio of the alternating current grounding insulation impedance to the direct current grounding insulation impedance; and
obtaining, by the inverter, the impedance value of the alternating current grounding insulation impedance based on the voltage division ratio and the impedance value of the direct current grounding insulation impedance.

5. The method according to claim 1, wherein the first common-mode voltage is an alternating current voltage;
the injecting, by the inverter, a first common-mode voltage into the alternating current cable comprises:
injecting, by the inverter, the first common-mode voltage at a first frequency into the alternating current cable; and
the obtaining, by the inverter, a second common-mode voltage on the alternating current grounding insulation impedance comprises:
acquiring, by the inverter, a fourth common-mode voltage on the alternating current cable, and extracting, from the fourth common-mode voltage, the second common-mode voltage at the first frequency.

6. The method according to claim 1, wherein the alternating current grounding insulation impedance comprises alternating current grounding insulation impedance and alternating current grounding insulation capacitance; and
wherein injecting, by the inverter, the first common-mode voltage into the alternating current cable comprises:
separately injecting, by the inverter, at least two first common-mode voltages with different voltage characteristics into the alternating current cable; and
wherein obtaining, by the inverter, the second common-mode voltage on the alternating current grounding insulation impedance comprises:
obtaining second common-mode voltages corresponding to the at least two first common-mode voltages with different voltage characteristics;
obtaining, by the inverter based on the at least two first common-mode voltages with different voltage characteristics, the second common-mode voltages corresponding to the at least two first common-mode voltages with different voltage characteristics, and the impedance value of the direct current grounding insulation impedance, association relationships that are between the alternating current grounding insulation impedance and the alternating current grounding insulation capacitance and that respectively corresponds to the at least two first common-mode voltages with different voltage characteristics; and
wherein obtaining, by the inverter, the impedance value of the alternating current grounding insulation impedance based on the first common-mode voltage, the second common-mode voltage, and the impedance value of the direct current grounding insulation impedance comprises:
obtaining, by the inverter based on the association relationships that are between the alternating current grounding insulation impedance and the alternating current grounding insulation capacitance and that respectively correspond to the at least two first common-mode voltages with different voltage characteristics, an impedance value of the alternating current grounding insulation impedance and a capacitance value of the alternating current grounding insulation capacitance.

7. The method according to claim 6, wherein
when a first common-mode voltage is a voltage in an alternating current form, the voltage characteristic of that first common-mode voltage comprises one or more of a frequency, an amplitude, or a phase; or
when a first common-mode voltage is a voltage in a direct current form, the voltage characteristic of that first common-mode voltage comprises an amplitude and/or a phase.

8. The method according to claim 1, wherein the alternating current cable is a single-phase cable.

9. The method according to claim 1, wherein the alternating current cable is a three-phase cable, and the alternating current grounding insulation impedance comprises three alternating current grounding insulation subimpedances respectively corresponding to the three-phase cable; and
wherein injecting, by the inverter, the first common-mode voltage into the alternating current cable comprises:
separately injecting, by the inverter, three first common-mode voltages with different voltage characteristics into the alternating current cable;
wherein obtaining, by the inverter, the second common-mode voltage on the alternating current grounding insulation impedance comprises:
obtaining second common-mode voltages corresponding to the three first common-mode voltages with different voltage characteristics;
obtaining, by the inverter based on the three first common-mode voltages with different voltage characteristics, the second common-mode voltages corresponding to the three first common-mode voltages with different voltage characteristics, and the impedance value of the direct current grounding insulation impedance, association relationships that are between the three alternating current grounding insulation subimpedances and that respectively corresponds to the three first common-mode voltages with different voltage characteristics; and
wherein obtaining, by the inverter, the impedance value of the alternating current grounding insulation impedance based on the first common-mode voltage, the second common-mode voltage, and the impedance value of the direct current grounding insulation impedance comprises:
obtaining, by the inverter based on the association relationships that are between the three alternating current grounding insulation subimpedances and that respectively correspond to the three first common-mode voltages with different voltage characteristics, impedance values respectively corresponding to the three alternating current grounding insulation subimpedances.

10. The method according to claim 1, wherein
the power supply/consumption device comprises a loading device; and/or
the power supply/consumption device comprises an isolation transformer and a grid, wherein an input terminal of the isolation transformer is connected to the inverter, and an output terminal of the isolation transformer is connected to the grid.

11. An inverter, comprising a control circuit, an inverter circuit, and a voltage sampling circuit, wherein the control circuit is separately connected to a control terminal of the inverter circuit and an output terminal of the voltage sampling circuit, an input terminal of the inverter circuit is connected to a photovoltaic unit, the photovoltaic unit has a direct current grounding insulation impedance, an output terminal of the inverter circuit is connected to a power supply/consumption device by using an alternating current cable, and the alternating current cable has an alternating current grounding insulation impedance, wherein
the inverter circuit is configured to: convert direct current electrical energy from the photovoltaic unit into alternating current electrical energy and then merge the alternating current electrical energy into the power supply/consumption device;
the control circuit is configured to control the inverter circuit to inject a first common-mode voltage into the alternating current cable, wherein the first common-mode voltage is equal to a sum of a voltage on the alternating current grounding insulation impedance and a voltage on the direct current grounding insulation impedance;
the voltage sampling circuit is configured to: acquire a second common-mode voltage on the alternating current grounding insulation impedance and send the second common-mode voltage to the control circuit; and
the control circuit is further configured to obtain an impedance value of the alternating current grounding insulation impedance based on the first common-mode voltage, the second common-mode voltage, and an impedance value of the direct current grounding insulation impedance, wherein the control circuit is further connected to the photovoltaic unit, and
the control circuit is further configured to:
before the inverter circuit merges the direct current electrical energy from the photovoltaic unit into the power supply/consumption device, obtain the impedance value of the direct current grounding insulation impedance based on electrical characteristics output by the photovoltaic unit.

12. The inverter according to claim 11, further comprising a preset impedor, wherein the photovoltaic unit is connected to the inverter circuit by using a direct current cable, and the direct current cable is grounded by using the preset impedor;
before the inverter circuit merges the direct current electrical energy from the photovoltaic unit into the power supply/consumption device,
the voltage sampling circuit is further configured to: acquire a first voltage of the photovoltaic unit and send the first voltage to the control circuit, and acquire a second voltage of the preset impedor and send the second voltage to the control circuit, wherein the first voltage is equal to a sum of a voltage on the preset impedor and the voltage on the direct current grounding insulation impedance; and the control circuit is configured to obtain the impedance value of the direct current grounding insulation impedance based on the first voltage, the second voltage, and an impedance value of the preset impedor.

13. The inverter according to claim 11, wherein the control circuit is further configured to:
before controlling the inverter circuit to inject the first common-mode voltage into the alternating current cable, control the inverter circuit to merge the direct current electrical energy output by the photovoltaic unit into the power supply/consumption device.

14. The inverter according to claim 11, wherein the control circuit is configured to:
obtain a differential voltage between the first common-mode voltage and the second common-mode voltage as a third common-mode voltage on the direct current grounding insulation impedance;
obtain a ratio of the second common-mode voltage to the third common-mode voltage as a voltage division ratio of the alternating current grounding insulation impedance to the direct current grounding insulation impedance; and
obtain the impedance value of the alternating current grounding insulation impedance based on the voltage division ratio and the impedance value of the direct current grounding insulation impedance.

15. The inverter according to claim 11, wherein the first common-mode voltage is an alternating current voltage;
the control circuit is configured to control the inverter circuit to inject the first common-mode voltage at a first frequency into the alternating current cable; and
the voltage sampling circuit is configured to: acquire a fourth common-mode voltage on the alternating current cable, extract, from the fourth common-mode voltage, the second common-mode voltage at the first frequency, and send the second common-mode voltage to the control circuit.

16. The inverter according to claim 11, wherein the alternating current grounding insulation impedance comprises alternating current grounding insulation impedance and alternating current grounding insulation capacitance;
the control circuit is configured to control the inverter circuit to separately inject at least two first common-mode voltages with different voltage characteristics into the alternating current cable;
the voltage sampling circuit is configured to: separately acquire second common-mode voltages on the alternating current grounding insulation impedance at the at least two first common-mode voltages with different voltage characteristics, and send the second common-mode voltages to the control circuit; and
the control circuit is configured to: obtain, based on the at least two first common-mode voltages with different voltage characteristics, the second common-mode voltages corresponding to the at least two first common-mode voltages with different voltage characteristics, and the impedance value of the direct current grounding insulation impedance, association relationships that are between the alternating current grounding insulation impedance and the alternating current grounding insulation capacitance and that respectively corresponds to the at least two first common-mode voltages with different voltage characteristics; and obtain, based on the association relationships that are between the alternating current grounding insulation impedance and the alternating current grounding insulation capacitance and that respectively correspond to the at least two first common-mode voltages with different voltage characteristics, an impedance value of the alternating current grounding insulation impedance and a capacitance value of the alternating current grounding insulation capacitance.

17. The inverter according to claim 11, wherein the alternating current cable is a single-phase cable.

18. The inverter according to claim 11, wherein the alternating current cable is a three-phase cable, and the alternating current grounding insulation impedance comprises three alternating current grounding insulation subimpedances respectively corresponding to the three-phase cable;

the control circuit is configured to separately inject three first common-mode voltages with different voltage characteristics into the alternating current cable;

the voltage sampling circuit is configured to: separately acquire second common-mode voltages on the alternating current grounding insulation impedance at the three first common-mode voltages with different voltage characteristics, and send the second common-mode voltages to the control circuit; and the control circuit is configured to: obtain, based on the three first common-mode voltages with different voltage characteristics, the second common-mode voltages corresponding to the three first common-mode voltages with different voltage characteristics, and the impedance value of the direct current grounding insulation impedance, association relationships that are between the three alternating current grounding insulation subimpedances and that respectively correspond to the three first common-mode voltages with different voltage characteristics; and obtain, based on the association relationships that are between the three alternating current grounding insulation subimpedances and that respectively correspond to the three first common-mode voltages with different voltage characteristics, impedance values respectively corresponding to the three alternating current grounding insulation subimpedances.

* * * * *